United States Patent
Kaeriyama

(10) Patent No.: US 9,520,804 B2
(45) Date of Patent: Dec. 13, 2016

(54) POWER CONVERTER AND MATRIX CONVERTER

(71) Applicant: RENESAS ELECTRONICS CORPORATION, Kanagawa (JP)

(72) Inventor: Shunichi Kaeriyama, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 886 days.

(21) Appl. No.: 13/865,339

(22) Filed: Apr. 18, 2013

(65) Prior Publication Data

US 2013/0308355 A1    Nov. 21, 2013

(30) Foreign Application Priority Data

May 16, 2012 (JP) ................................ 2012-112709

(51) Int. Cl.
| | | |
|---|---|---|
| H02M 1/32 | (2007.01) | |
| H02M 7/537 | (2006.01) | |
| H02M 5/297 | (2006.01) | |

(52) U.S. Cl.
CPC ............ *H02M 7/537* (2013.01); *H02M 5/297* (2013.01); *H01L 2224/48091* (2013.01); *H01L 2224/48137* (2013.01)

(58) Field of Classification Search
CPC ...... H02M 1/32; H02M 3/1584; H02M 3/285; H02M 5/273; H02M 5/293; H02H 7/1216; H02J 1/102
USPC ....................... 363/50, 125, 163; 307/82, 104
See application file for complete search history.

(56) References Cited

U.S. PATENT DOCUMENTS

| | | | |
|---|---|---|---|
| 5,517,402 A | 5/1996 | Ikeda et al. | |
| 5,892,677 A | 4/1999 | Chang | |
| 8,854,104 B2* | 10/2014 | Chung | H03L 5/00 326/80 |
| 8,947,838 B2* | 2/2015 | Yamai | H02P 29/022 361/23 |
| 9,219,509 B1* | 12/2015 | Ware | H04B 1/10 |
| 2004/0095111 A1* | 5/2004 | Kernahan | H02M 3/157 323/282 |
| 2009/0230938 A1 | 9/2009 | Sakurai | |

(Continued)

FOREIGN PATENT DOCUMENTS

| | | |
|---|---|---|
| CN | 101174798 A | 5/2008 |
| CN | 101997667 A | 3/2011 |

(Continued)

OTHER PUBLICATIONS

Japanese Office Action received in corresponding Japanese Application No. 2012-112709 dated Jan. 26, 2016.

(Continued)

*Primary Examiner* — Adolf Berhane
(74) *Attorney, Agent, or Firm* — Mattingly & Malur, PC

(57) ABSTRACT

The number of ICs used for a power converter is reduced. The power converter includes n power transistors each having an emitter terminal or a source terminal connected to a common line, and driver ICs. Each of the driver ICs includes n pre-drivers that drive the respective n power transistors, and a receiver circuit that is integrated monolithically with the n pre-drivers. The receiver circuit is coupled with a transmitter circuit by AC coupling, and outputs a control signal that controls the n pre-drivers in response to a signal received from the transmitter circuit.

11 Claims, 18 Drawing Sheets

(56) References Cited

U.S. PATENT DOCUMENTS

| | | | | |
|---|---|---|---|---|
| 2010/0052430 A1* | 3/2010 | Takaishi | ............... | G06K 7/0008 307/104 |
| 2011/0038286 A1 | 2/2011 | Ta et al. | | |
| 2012/0161816 A1* | 6/2012 | Seth | ............... | H03K 19/018521 327/108 |
| 2013/0163126 A1* | 6/2013 | Dong | ................. | G06F 13/4086 361/56 |
| 2013/0285465 A1* | 10/2013 | Takeda | .................... | H01F 38/14 307/104 |
| 2015/0269112 A1* | 9/2015 | Hsueh | ................ | G06F 13/4282 710/106 |

FOREIGN PATENT DOCUMENTS

| | | |
|---|---|---|
| JP | 05-344751 A | 12/1993 |
| JP | 7-213057 A | 8/1995 |
| JP | 2004-282940 A | 10/2004 |
| JP | 2007-185024 A | 7/2007 |
| JP | 2009-219294 A | 9/2009 |
| JP | 2010-263671 A | 11/2010 |
| JP | 2011-101466 A | 5/2011 |
| JP | 2012-80156 A | 4/2012 |

OTHER PUBLICATIONS

Taiwanese Office Action received in corresponding Taiwanese Application No. 10520817400 dated Jul. 1, 2016.
Chinese Office Action received in corresponding Chinese Application No. 201310185590.5 dated Jul. 26, 2016.

\* cited by examiner

POWER CONVERTER AND MATRIX CONVERTER

CROSS-REFERENCE TO RELATED APPLICATIONS

The disclosure of Japanese Patent Application No. 2012-112709 filed on May 16, 2012 including the specification, drawings, and abstract is incorporated herein by reference in its entirety.

BACKGROUND

The present invention relates to a power converter, and more particularly to a configuration of a driver circuit group for driving power transistors in a power converter.

In a matrix converter, an inverter, and the other power converters, there is frequently used power transistors (for example, IGBT (insulated gate bipolar transistor), or a MOSFET (metaloxide semiconductor field effect transistor), which can conduct a large current and block a high voltage. In the power converter, a pre-driver is generally used for driving a gate terminal of each power transistor. A signal for controlling on/off operation of the power transistor is supplied to the pre-driver from a control circuit, and the pre-driver drives the gate terminal of the power transistor in response to the control signal.

As well known by an ordinary skilled person, an electric isolation needs to be obtained between the pre-driver for driving the power transistor and the control circuit, that is, a circuit ground needs to be separated therebetween. The most typical technique for isolating the pre-driver and the control circuit from each other is to use an optocoupler. Since the optocoupler transmits a signal as an optical signal (not an electric signal), the pre-driver and the control circuit can be electrically isolated from each other with the use of the optocoupler.

However, because the optocoupler requires optical isolation between channels, it is difficult to integrate several channels of the optocoupler into an IC (integrated circuit). Accordingly, the use of the optocoupler causes the number of ICs used for the power converter to increase. For example, in a three-phase matrix converter using a pair of power transistors as a bidirectional switch, 18 power transistors are provided. In the three-phase matrix converter, optocouplers and 18 pre-driver ICs are required. As the number of ICs used for the power supply is more increased, the installation area increases more, and the costs also increases more.

A technique has also been known in which the optocoupler is replaced with a pulse transformer for the purpose of electrically isolating the pre-driver and the control circuit from each other (for example, refer to Japanese Unexamined Patent Application Publication No. 2009-219294). Also, Japanese Unexamined Patent Application Publication No. 2010-263671 discloses a technique in which the pulse transformer is replaced with a pair of coils mounted on a printed circuit board. Further, Japanese Unexamined Patent Application Publication No. Hei 5(1993)-344751 discloses a technique in which, in order to reduce the number of power supplies, the pulse transformer is used for a power transistor of an upper arm whereas no pulse transformer is used for the power transistor of a lower arm.

However, those techniques insufficiently cope with such a problem that the number of ICs used for the power converter increases.

SUMMARY

Thus, the related art suffers from such a problem that the number of ICs used for the power converter increased.

The other problems and novel features will become apparent from the description of the present specification and the attached drawings.

According to one aspect of the invention, the power converter includes n power transistors each having an emitter terminal or a source terminal connected to a common line, and a driver. The driver includes n pre-drivers that drive the respective n power transistors, and a receiver monolithically integrated with the n pre-drivers. The receiver is coupled with a transmitter by AC coupling, and outputs a control signal that controls the n pre-drivers in response to a transmission signal received from the transmitter.

According to another aspect of the invention, a driver includes n pre-drivers that drive respective n power transistors each having an emitter terminal or a source terminal connected to a common line, and a receiver monolithically integrated with the n pre-drivers. The receiver is coupled with a transmitter by AC coupling, and generates a control signal that controls the n pre-drivers in response to a transmission signal received from the transmitter.

According to the above aspects of the invention, the number of ICs used for the power converter can be reduced.

DETAILED DESCRIPTION

Figure 1:
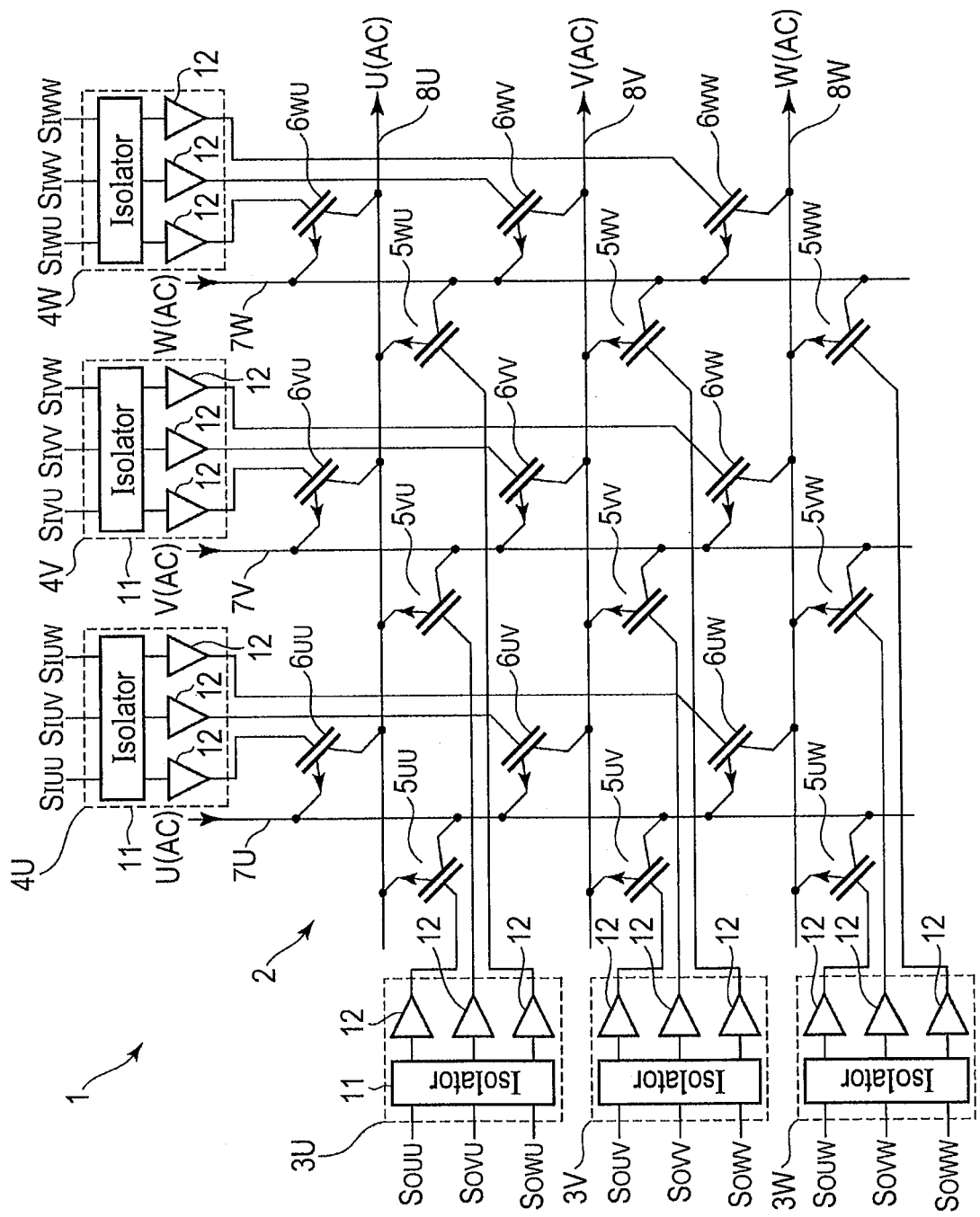
FIG. 1 is a circuit diagram illustrating a configuration of a power converter configured as matrix converter according to a first embodiment.

In a power converter according to this embodiment, power transistors (for example, IGBTs or MOSFETs) each having an emitter terminal or a source terminal connected to a common line are driven by one driver IC. The driver IC is integrated with n pre-drivers and an isolator that transmits a signal with the use of AC coupling (inductor coupling or capacitor coupling). In the IC, the occupied area for an AC coupling (on-chip inductor or capacitor) is much smaller than that for an optical isolation channel. Therefore, on-chip AC coupling devices make it possible to integrate multiple isolation channels into a single IC chip and it is more suitable for the matrix converters or the other power converters which employ many power transistors. The n pre-drivers are isolated from an input terminal of the driver IC by the isolator.

In the driver IC, a transmitter and a receiver of the isolator may be integrated with separate semiconductor substrates. In this case, the transmitter is integrated with a first semiconductor substrate, and the receiver and the n pre-drivers are integrated monolithically with a second semiconductor substrate. Attention should be paid to configuration in which the n pre-drivers and the receiver of the isolator can be integrated with an identical semiconductor substrate since the isolator using the AC coupling can be formed by a CMOS process. In this case, a circuit ground of the first semiconductor substrate and a circuit ground of the second semiconductor substrate are electrically isolated from each other. Each emitter terminal (when an IGBT is used as the power transistor) or each source terminal (when a MOSFET is used as the power transistor) of the n power transistors is connected to the circuit ground of the second semiconductor substrate.

Also, the transmitter, the receiver, and the n pre-drivers may be integrated monolithically with an identical semiconductor substrate. In this case, in order to separate the circuit grounds from each other, a first semiconductor region integrated with the transmitter and a second semiconductor region integrated with the receiver and the n pre-drivers are isolated from each other. Each emitter terminal or each source terminal of the n power transistors is connected to the circuit ground of the second semiconductor region.

According to the power converter thus configured, the power transistors can be driven by a smaller number of driver ICs, and the costs can be effectively reduced. In more detail, in an N input M output power converter, the emitter terminal or the source terminal of each power transistor is connected to any one of N inputs or M outputs. Accordingly, the number of emitter potentials or source potentials is N+M. In more detail, there are M power transistors having the respective emitter potentials or source potentials of $V_{X1}$, $V_{X2}$, ..., $V_{XN}$, and N power transistors having the respective emitter potentials or source potentials of $V_{Y1}$, $V_{Y2}$, ..., $V_{YM}$. Hence, the M driver ICs having N outputs and the N driver ICs having M outputs can drive the power transistors included in the power converter.

For example, in the N input M output matrix converter, N×M×2 power transistors are provided as a bidirectional switch. When the gate terminals of the M×N×2 power transistors are driven by the pre-drivers isolated from each other by optocouplers, N×M×2 optocouplers and N×M×2 pre-driver ICs are required. This is because optical isolation is required between channels thus resulting in lower integration level and preventing us from integrating multiple isolation channels into a single chip. On the other hand, in the configuration of the power converter according to this embodiment, the M×N×2 power transistors can be driven by the N+M driver ICs. In a more detailed example, 18 power converters are provided for a three-phase matrix converter having three inputs and three outputs. In this case, in the configuration of the power converter using the pre-drivers isolated from each other by the optocouplers, 18 optocouplers and 18 pre-driver ICs are required. On the other hand, in the configuration of the power converter according to this embodiment, 18 power transistors can be driven by 6 (=3+3) driver ICs.

Hereinafter, a variety of embodiments of the above power converter will be described in detail.

First Embodiment

FIG. 1 is a circuit diagram illustrating a configuration of a power converter according to a first embodiment. The power converter according to the first embodiment is configured as a three-phase matrix converter 1 which input and output are both three-phase AC. The three-phase matrix converter 1 includes a transistor matrix 2. The transistor matrix 2 includes power transistors 5, 6 for conducting a commutation between the input and the output, input lines 7U, 7V, 7W connected to U-phase, V-phase, and W-phase inputs, respectively, and output lines 8U, 8V, 8W connected to U-phase, V-phase, and W-phase outputs, respectively. In FIG. 1, a power transistor that conducts a commutation from a j-phase input to a k-phase output is indicated by symbol $5_{jk}$, and a power transistor that conducts a commutation from a k-phase output to a j-phase input is indicated by symbol $6_{jk}$. In this example, j is any one of U, V, and W, and k is any one of U, V, and W. For example, a power transistor $5_{UV}$ is a power transistor that conducts a commutation from the U-phase input to the V-phase output, and a power transistor $6_{UV}$ is a power transistor that conducts a commutation from the V-phase output to the U-phase input. In this embodiment, the transistor matrix 2 has 18 power transistors. In this embodiment, IGBTs are used as power transistors 5 and 6.

The input lines 7U, 7V, and 7W may be applied or supplied with any one of a three-phase voltage and a three-phase current. When the three-phase voltage is applied to the input lines 7U, 7V, and 7W (that is, when a U-phase voltage, a V-phase voltage, and a W-phase voltage are applied to the input lines 7U, 7V, and 7W, respectively), the three-phase matrix converter 1 functions as a voltage type matrix converter. Likewise, when the three-phase current is supplied to the input lines 7U, 7V, and 7W, the three-phase matrix converter 1 functions as a current type matrix converter.

The three-phase matrix converter 1 further includes six driver ICs 3U, 3V, 3W, 4U, 4V, and 4W. Those six driver ICs drive the above-mentioned 18 power transistors 5 and 6. That is, in this embodiment, the respective driver ICs (3, 4) are configured to drive the gate terminals of those three power transistors (5, 6). In detail, control signals $S_{OUj}$, $S_{OVj}$, and $S_{OWj}$ are supplied to a driver IC 3j, and gate terminals of the power transistors $5_{Uj}$, $5_{Vj}$, and $5_{Wj}$ are driven in response to the control signals $S_{OUj}$, $S_{OVj}$, and $S_{OWj}$, respectively. In this example, j is any one of U, V, and W. Likewise, control signals $S_{IkU}$, $S_{IkV}$, and $S_{IkW}$ are supplied to a driver IC 4k, and the gate terminals of power transistors $6_{kU}$, $6_{kV}$, and $6_{kW}$ are driven in response to the control signals $S_{IkU}$, $S_{IkV}$, and $S_{IkW}$.

Attention is paid to a configuration in which each of the driver ICs drives the gate terminals of the three power transistors each having an emitter connected to an identical line (common line). For example, the driver IC 3U drives three power transistors $5_{UU}$, $5_{VU}$, and $5_{WU}$ each having an emitter commonly connected to the input line 8U. Likewise, the driver IC 4U drives three power transistors $6_{kU}$, $6_{kV}$, and $6_{kW}$ each having an emitter commonly connected to the input line 7U.

Figure 2:
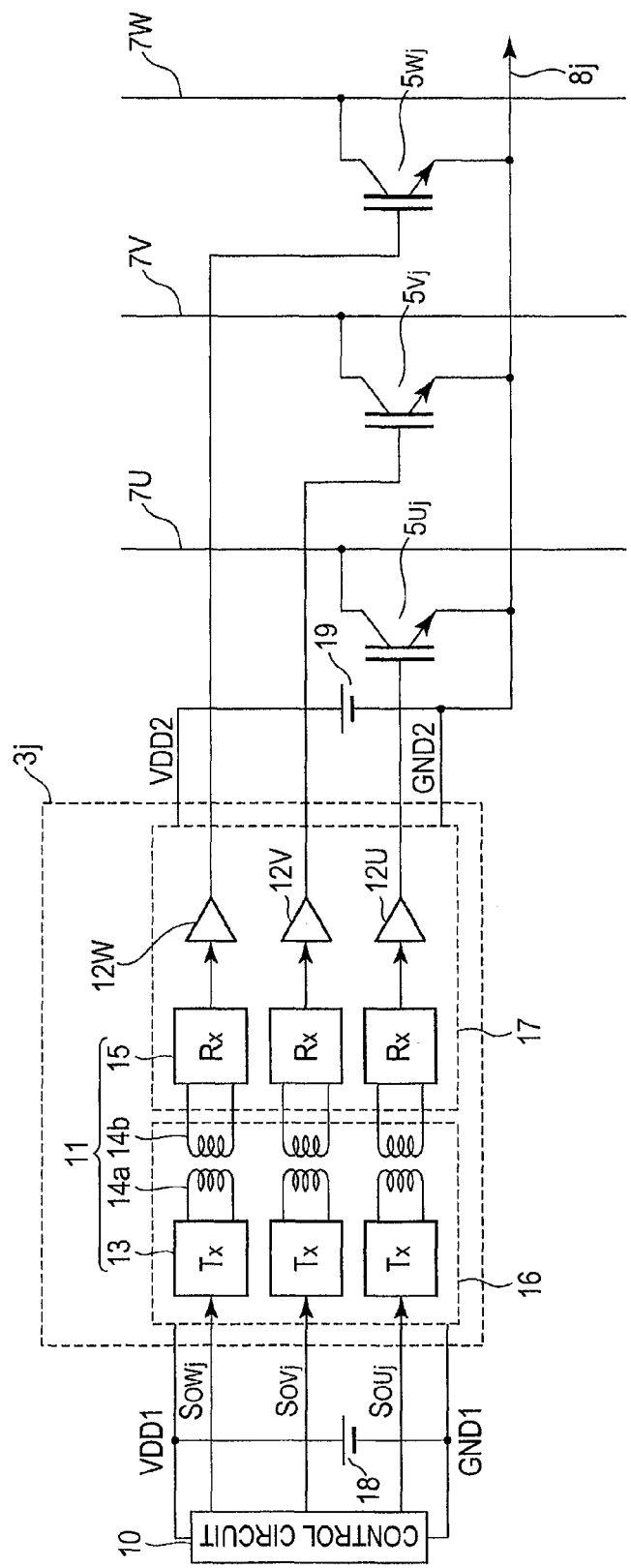
FIG. 2 is a block diagram illustrating a configuration of a driver IC in the matrix converter of FIG. 1.

Each of the driver ICs 3U, 3V, 3W, 4U, 4V, 4W includes an isolator 11 and three pre-drivers 12. In FIG. 2, the isolator 11 has a function of transmitting a control signal supplied thereto to a corresponding pre-driver 12 while electrically isolating the input and output from each other. For example, the isolator 11 of the driver IC 3U transmits control signals $S_{OUU}$, $S_{OVU}$, and $S_{OWU}$ to the pre-drivers 12 for driving power transistors $5_{UU}$, $5_{VU}$, and $5_{WU}$, respectively. Each of the pre-drivers 12 drives the gate terminal of the corresponding power transistor in response to the control signal supplied thereto.

FIG. 2 is a block diagram illustrating a configuration of a driver IC 3j (j is any one of U, V, and W) according to the first embodiment. As illustrated in FIG. 2, the isolator 11 includes transmitter circuits 13, coils 14a, 14b, and receiver circuits 15. The coils 14a, 14b configure AC coupling (inductor coupling in FIG. 2), and a signal is transmitted from each transmitter circuit 13 to each receiver circuit 15 while isolating the transmitter circuit 13 and the receiver circuit 15 from each other with the use of the AC coupling. That is, a pair of the transmitter circuit 13 and the receiver circuit 15 configure a communication link through the coils 14a and 14b. The control signals $S_{OUj}$, $S_{OVj}$, and $S_{OWj}$ supplied to the transmitter circuit 13 from a control circuit 10 are transmitted to the pre-drivers 12U, 12V, and 12W through the transmitter circuits 13, the coils 14a, 14b, and the receiver circuits 15, respectively. In this example, the pre-drivers 12U, 12V, and 12W are configured to drive the power transistors $5_{Uj}$, $5_{Vj}$, and $5_{Wj}$, respectively. Attention is paid to a configuration in which the emitters of the power transistors $5_{Uj}$, $5_{Vj}$, and $5_{Wj}$ are commonly connected to the output line 8j.

In this embodiment, a circuit group configuring the respective driver ICs 3j is integrated into two semiconductor substrates of a first semiconductor substrate 16 and a second semiconductor substrate 17. More specifically, in this embodiment, the transmitter circuits 13 and the coils 14a, 14b are integrated on the first semiconductor substrate 16, and the receiver circuits 15, and the pre-drivers 12U, 12V, 12W are integrated on the second semiconductor substrate 17. The first semiconductor substrate 16 and the second semiconductor substrate 17 are integrated into an identical package. The control circuit 10 and the first semiconductor substrate 16 are applied with a supply voltage VDD1 from an identical power supply 18, and the second semiconductor substrate 17 is applied with a supply voltage VDD2 from a power supply 19.

On the other hand, a circuit ground GND1 of the control circuit 10 and the respective circuits on the first semiconductor substrate 16, and a circuit ground GND2 of the respective circuits on the second semiconductor substrate 17 are electrically isolated from each other. In addition, the circuit ground GND2 of the second semiconductor substrate 17 is connected to the output line 8j. Attention is paid to a configuration in which, with the above configuration, the emitters of the power transistors $5_{Uj}$, $5_{Vj}$, and $5_{Wj}$ (driven by the pre-drivers 12U, 12V, and 12W integrated on the second semiconductor substrate 17) are commonly connected to the circuit ground GND2 of the second semiconductor substrate 17. As result, the drive voltages applied to the gate terminals of the power transistors $5_{Uj}$, $5_{Vj}$, and $5_{Wj}$ from the pre-drivers 12U, 12V, and 12W match voltages between the emitters and the gates of the power transistors $5_{Uj}$, $5_{Vj}$, and $5_{Wj}$. This means that the on/off operation of the power transistors $5_{Uj}$, $5_{Vj}$, and $5_{Wj}$ can be surely controlled according to the drive voltage applied to the gate terminals thereof.

Figure 3:
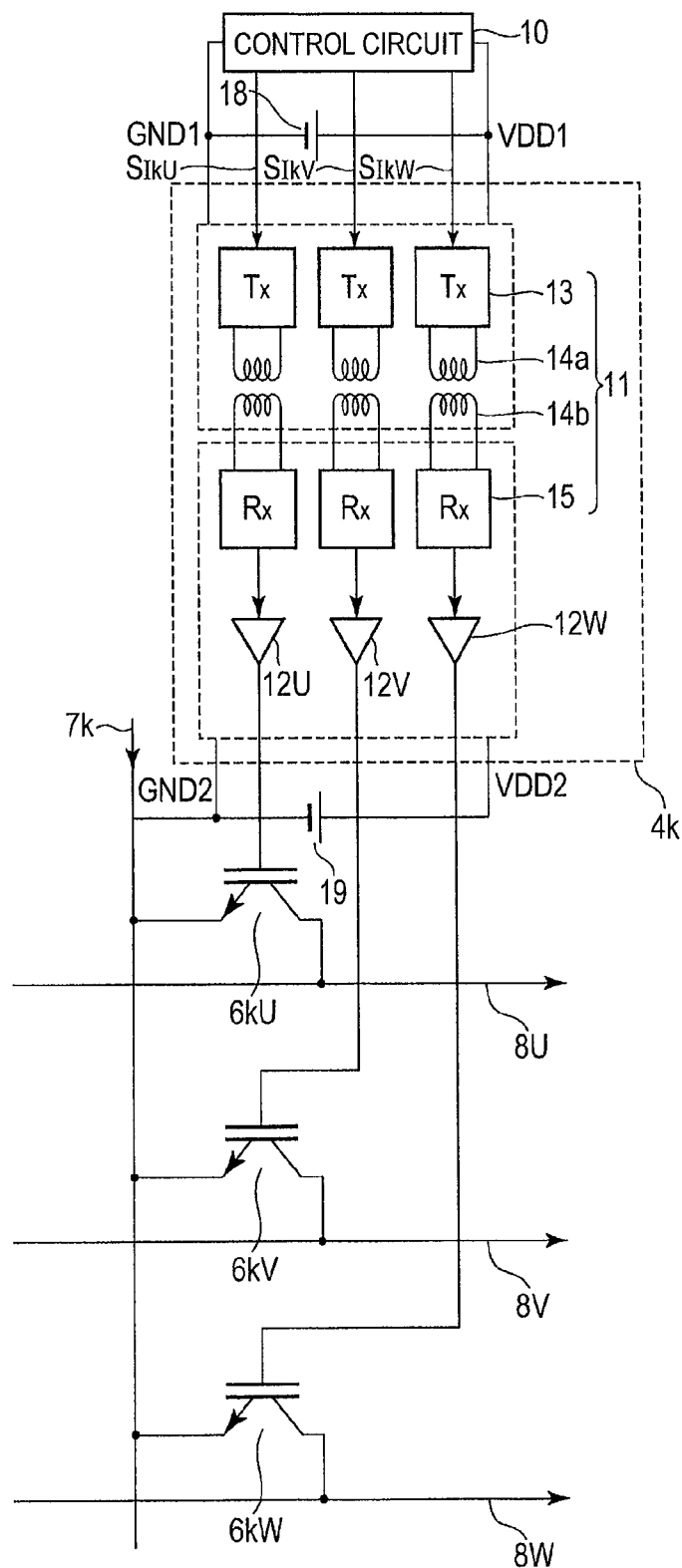
FIG. 3 is a block diagram illustrating the configuration of the driver IC in the matrix converter of FIG. 1.

As illustrated in FIG. 3, a driver IC 4k (k is any one of U, V, and W) is identical in configuration with the driver IC 3j except that the control signal to be input, and output targets of the drive voltages output by the pre-drivers 12U, 12V, and 12W are different from those in the driver IC 3j. Similarly, the driver IC 4k has two semiconductor substrates (first semiconductor substrate 16 and second semiconductor substrate 17). The transmitter circuits 13 and the coils 14a, 14b are integrated on the first semiconductor substrate 16, and the receiver circuits 15, and the pre-drivers 12U, 12V, 12W are integrated on the second semiconductor substrate 17. The pre-drivers 12U, 12V, and 12W drive the gate terminals of the power transistors $6_{kj}$, $6_{kV}$, and $6_{kW}$, respectively. Attention is paid to a configuration in which the emitters of the power transistors $6_{kj}$, $6_{kV}$, and $6_{kW}$ are commonly connected to an input line 7k, and the input line 7k is connected to the circuit ground GND2 of the second semiconductor substrate 17.

In the matrix converter 1 according to this embodiment, the power transistors $5_{Uj}$, $5_{Vj}$, and $5_{Wj}$ each having the emitter terminal commonly connected to the output line 8j are driven by the pre-drivers 12 integrated into the driver IC 3j. Likewise, the power transistors $6_{kU}$, $6_{kV}$, and $6_{kW}$ each having the emitter terminal commonly connected to the input line 7k are driven by the pre-drivers 12 integrated into the driver IC 4k. With the above configuration, in the matrix converter 1 according to this embodiment, 18 power transistors (5, 6) can be driven by six driver ICs (3, 4). In the configuration using the optocouplers, from the viewpoint that 18 optocouplers and 18 pre-driver IC are required for the purpose of driving the 18 power transistors, the advantage of the three-phase matrix converter 1 according to this embodiment is easily understood.

Figure 4:
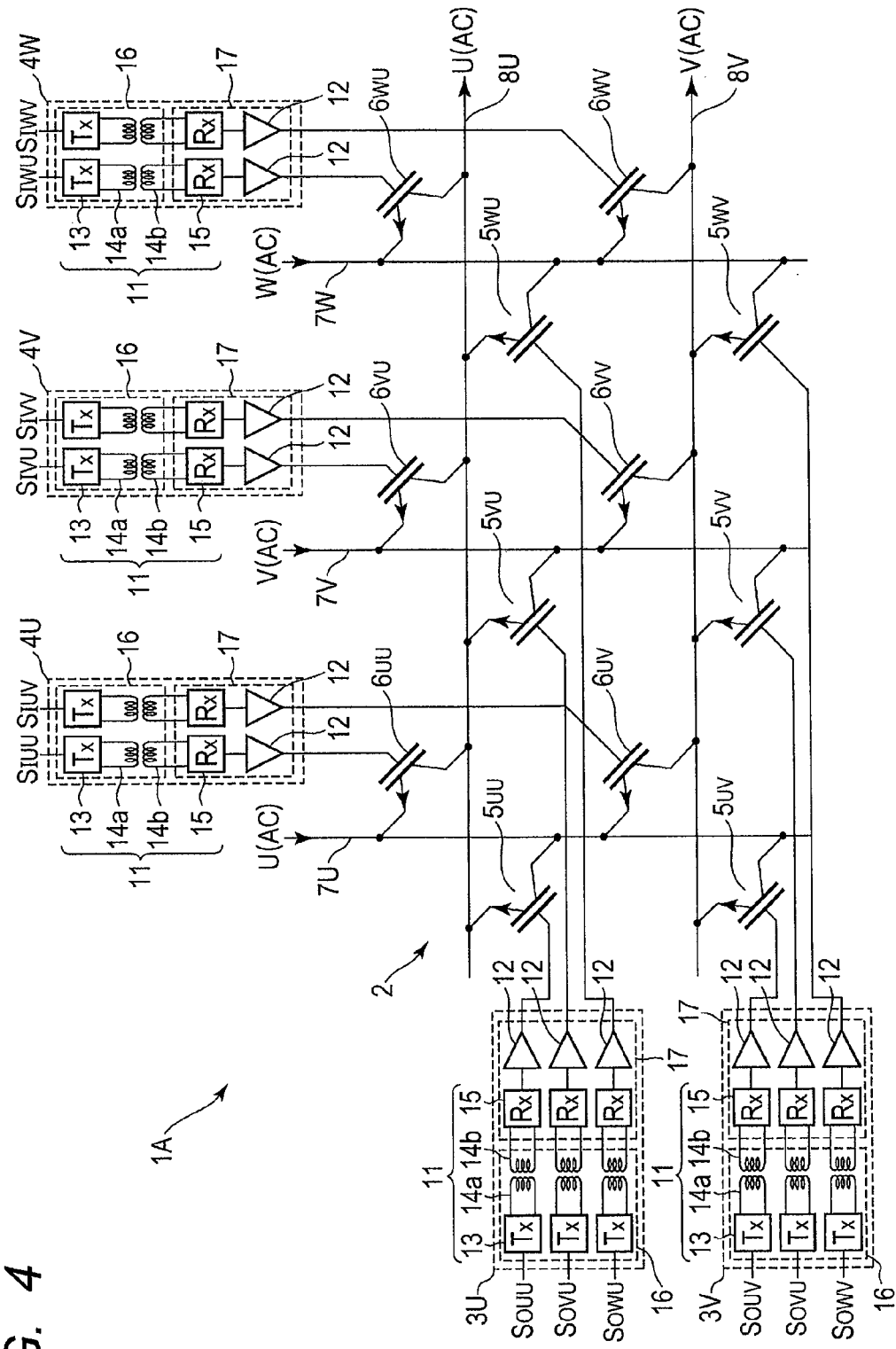
FIG. 4 is a circuit diagram illustrating another configuration of the matrix converter according to the first embodiment.

The number of inputs and/or the number of outputs of the matrix converter 1 can be variously changed. In this case, as described above, in the matrix converter of the N input M output, the power transistors of the matrix converter can be driven by the (M+N) driver ICs. For example, as illustrated in FIG. 4, a matrix converter 1A of 3 input 2 output includes 12 (=3×2×2) power transistors (5,6). Those 12 power transistors are driven by 5 (=3+2) driver ICs (3, 4). The driver IC 3j drives the power transistors $5_{Uj}$, $5_{Vj}$, and $5_{Wj}$ each having the emitter terminal commonly connected to the output line 8j, and the driver IC 4k drives the power transistors $6_{kU}$ and $6_{kV}$ having the emitter terminal commonly connected to the input line $7k$.

Second Embodiment

Figure 5:
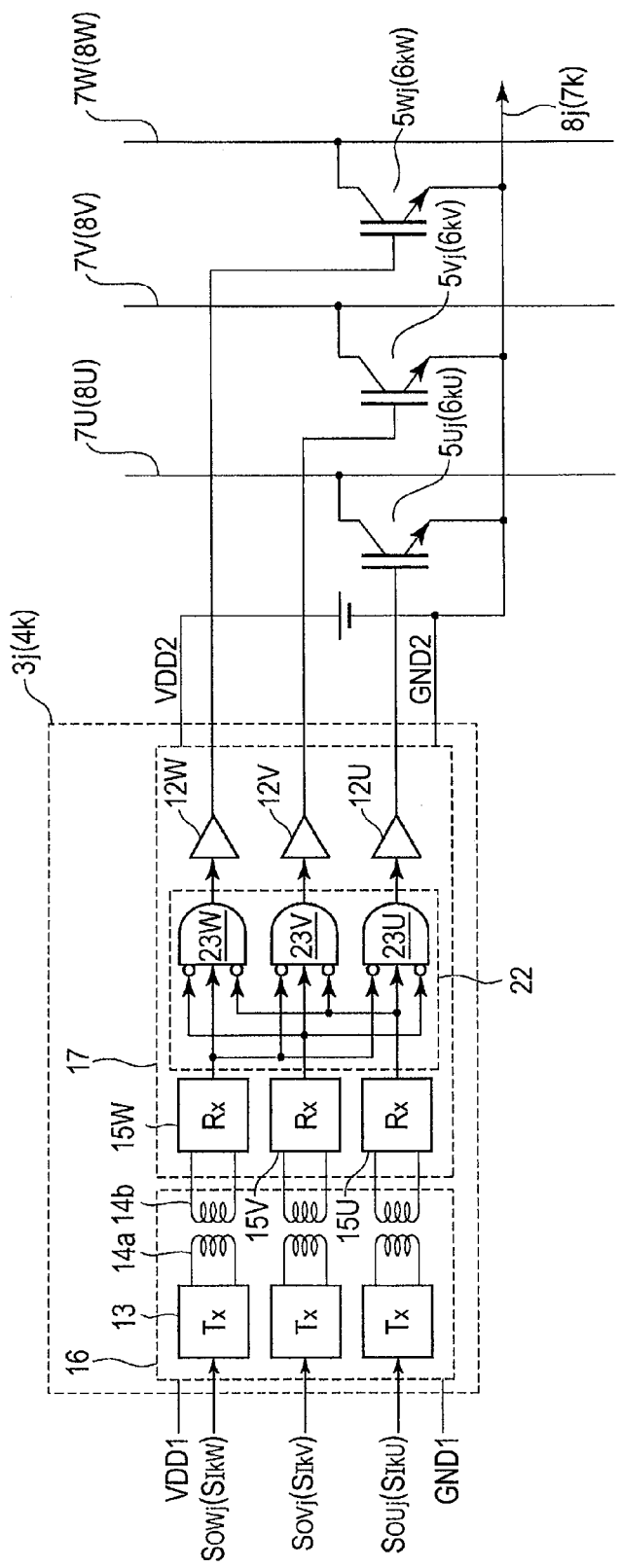
FIG. 5 is a block diagram illustrating a configuration of a driver IC in a power converter according to a second embodiment.

FIG. 5 is a block diagram illustrating a configuration of the driver IC $3j$ in the power converter according to a second embodiment. In this embodiment, a protection circuit 22 is additionally integrated on the second semiconductor substrate 17 on which the pre-drivers 12U, 12V, and 12W that drive the power transistors $5_{Uj}$, $5_{Vj}$, and $5_{Wj}$ are integrated. The protection circuit 22 has a function (protection function) of preventing two of the power transistors $5_{Uj}$, $5_{Vj}$, and $5_{Wj}$ from turning on at the same time.

In detail, the protection circuit 22 is connected between the receiver circuits 15U, 15V, 15W, and the pre-drivers 12U, 12V, 12W. In this example, the receiver circuits 15U, 15V, and 15W are configured to receive the control signal $S_{OUj}$ for controlling the power transistor $5_{Uj}$ through the transmitter circuit 13 and the coils 14a, 14b. In this example, the control signals $S_{OUj}$, $S_{OVj}$, and $S_{OWj}$ are generated as a value of "1" when turning on the power transistors $5_{Uj}$, $5_{Vj}$, and $5_{Wj}$, and as a value of "0" when turning off the power transistors $5_{Uj}$, $5_{Vj}$, and $5_{Wj}$, respectively. The protection circuit 22 has three AND gates 23U, 23V, and 23W. Three inputs of the AND gate 23U receive an output signal of the receiver circuit 15U, and inversion signals of output signals of the receiver circuits 15V and 15W. Three inputs of the AND gate 23V receive the output signal of the receiver circuit 15V, and the inversion signals of the output signals of the receiver circuits 15W and 15U. Further, three inputs of the AND gate 23W receive the output signal of the receiver circuit 15W, and the inversion signals of the output signals of the receiver circuits 15U and 15V.

In the protection circuit 22 thus configured, the input of the pre-driver 12U becomes "1" only when the control signal $S_{OUj}$ is "1", and the control signals $S_{OVj}$ and $S_{OWj}$ are "0". For that reason, the power transistor $5_{Uj}$ turns on only when the power transistors $S_{Vj}$ and $5_{Wj}$ are off. Likewise, the input of the pre-driver 12V becomes "1" only when the control signal $S_{OVj}$ is "1", and the control signals $S_{OWj}$ and $S_{OUj}$ are "0", and the input of the pre-driver 12W becomes "1" only when the control signal $S_{OWj}$ is "1", and the control signals $S_{OUj}$ and $S_{OVj}$ are "0". As a result, one power transistor of the power transistors $5_{Uj}$, $5_{Vj}$, and $5_{Wj}$ turns on only when the other two power transistors turn off, to thereby realize the protection function. Attention is paid to a fact that the above protection function of the protection circuit 22 can be realized because the pre-drivers 12U, 12V, and 12W are integrated on the identical semiconductor substrate (second semiconductor substrate 17).

Similarly, in the driver IC $4k$ that drives the power transistors $6_{kU}$, $6_{kV}$, and $6_{kW}$, the protection circuit 22 is integrated on the second semiconductor substrate 17 to realize the same protection function. Also, in this case, one power transistor of the power transistors $6_{kU}$, $6_{kV}$, and $6_{kW}$ turns on only when the other two power transistors turn off.

Third Embodiment

Figure 6:
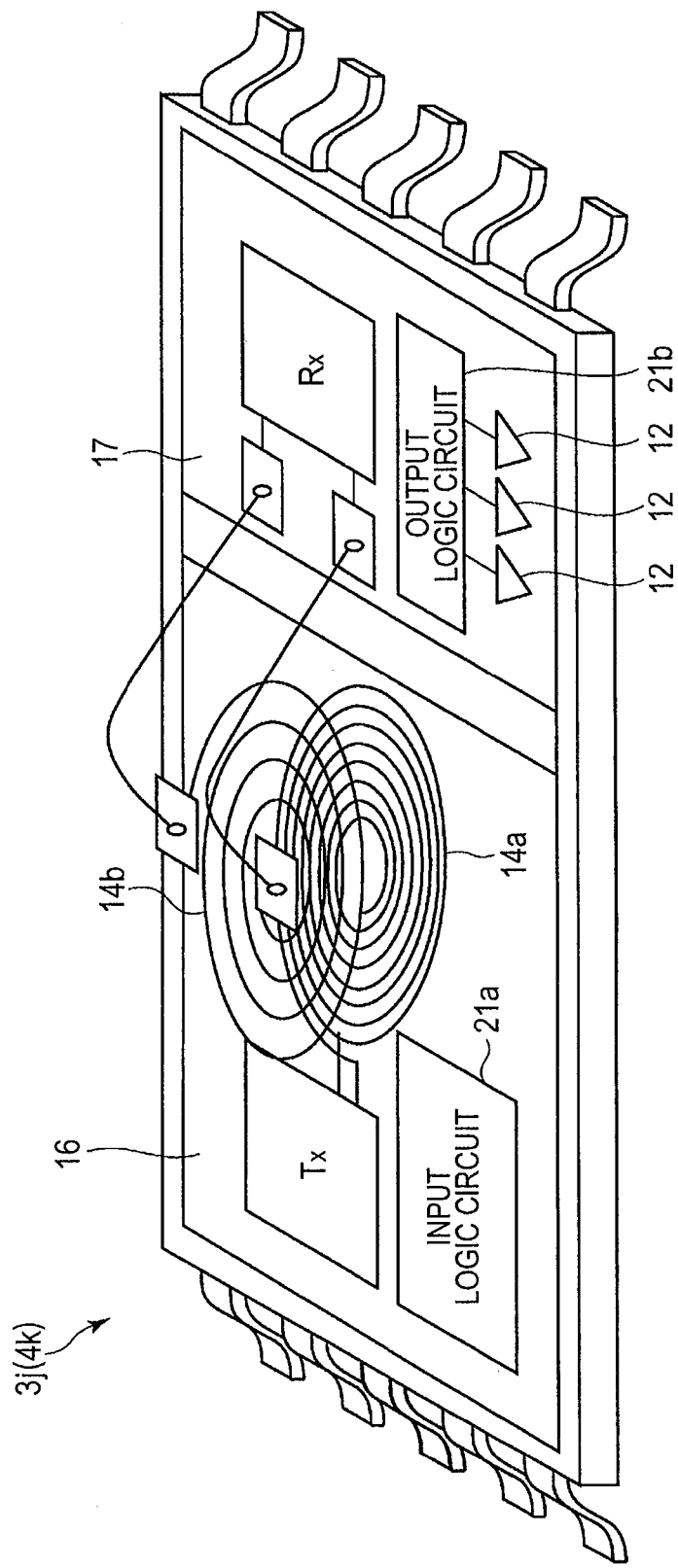
FIG. 6 is a perspective view conceptually illustrating a configuration of a driver IC in a power converter according to a third embodiment.
Figure 7A:
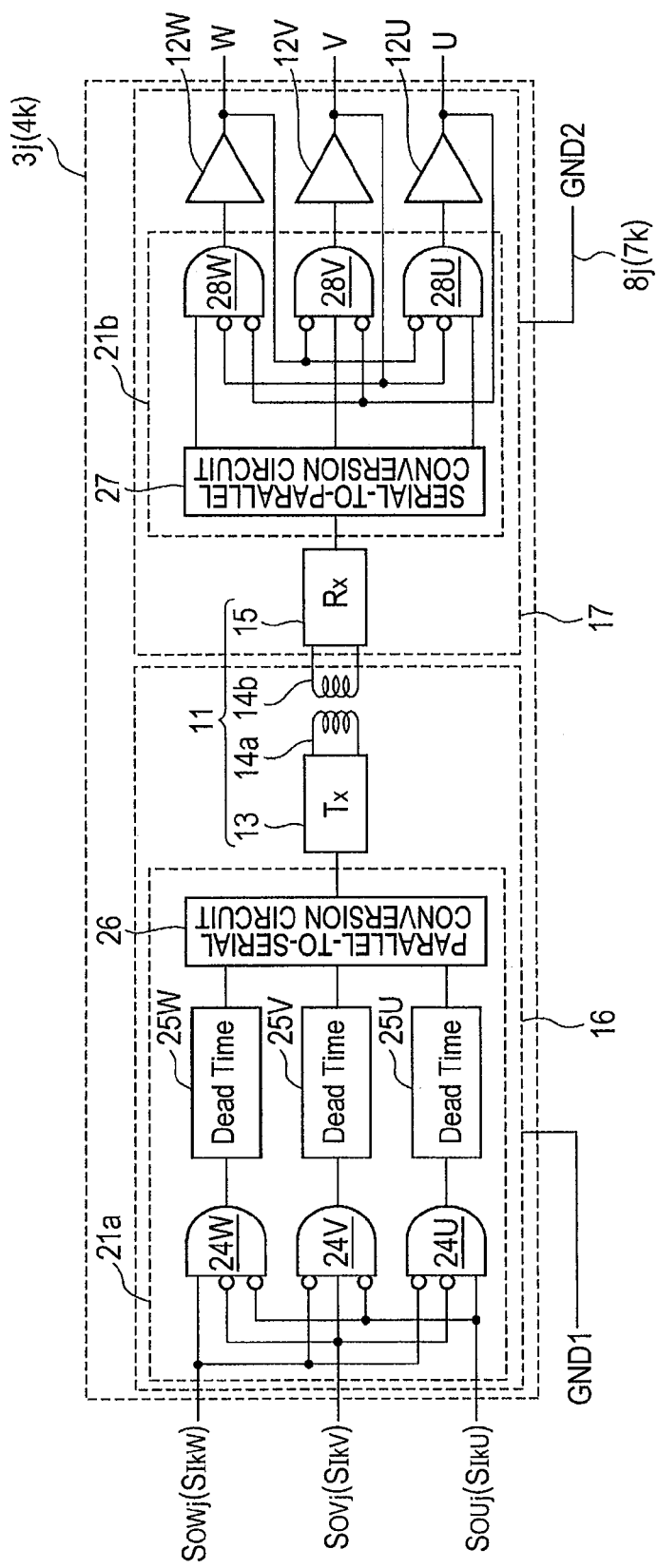
FIG. 7A is a block diagram illustrating the configuration of the driver IC in the power converter according to the third embodiment.

FIG. 6 is a conceptual diagram illustrating a configuration of the driver IC $3j$ in a power converter according to a third embodiment. FIG. 7A is a block diagram illustrating the configuration of the driver IC $3j$. In the first and second embodiments, the number of communication links configured by the transmitter circuit 13, the coils 14a, 14b, and the receiver circuit 15 is the same number as the power transistors (5, 6) to be driven by the respective driver ICs (3, 4). However, in general, since the communication link using the coils occupies a large area (typically, 100 μm square or more) on the semiconductor substrate, the area of the first semiconductor substrate 16 (or the second semiconductor substrate 17) is increased in this configuration.

In order to cope with this problem, in the driver ICs $3j$ and $4k$ according to the third embodiment, a parallel-to-serial conversion circuit and a serial-to-parallel conversion circuit are used to reduce the number of communication links integrated in the respective driver ICs $3j$ and $4k$.

In detail, with reference to FIG. 6, an input logic circuit $21a$ is integrated on the first semiconductor substrate 16 of the driver IC $3j$ in addition to the transmitter circuit 13, and the coils 14a, 14b. As illustrated in FIG. 7A, the input logic circuit $21a$ includes AND gates 24U, 24V, 24W, delay circuits 25U, 25V, and 25W for ensuring a dead time, and a parallel-to-serial conversion circuit 26.

The AND gates 24U, 24V, and 24W configure a circuit for preventing two or more outputs of the AND gates 24U, 24V, and 24W from becoming "1" at the same time, as with the protection circuit 22 in the second embodiment. In more detail, inputs of the AND gate 24U receive the control signal $S_{OUj}$, and also the inversion signals of the control signal $S_{OVj}$ and the control signal $S_{OWj}$. Likewise, inputs of the AND gate 24V receive the control signal $S_{OVj}$, and also the inversion signals of the control signal $S_{OWj}$ and the control signal $S_{OUj}$. Further, inputs of the AND gate 24W receive the control signal $S_{OWj}$, and also the inversion signals of the control signal $S_{OUj}$ and the control signal $S_{OVj}$. In this example, the control signals $S_{OUj}$, $S_{OVj}$, and $S_{OWj}$ are generated as a value of "1" when turning on the power transistors $5_{Uj}$, $5_{Vj}$, and $5_{Wj}$, and as a value of "0" when turning off the power transistors $5_{Uj}$, $5_{Vj}$, and $5_{Wj}$. Output signals of the AND gates 24U, 24V, and 24W are supplied to the parallel-to-serial conversion circuit 26 through the delay circuits 25U, 25V, and 25W for ensuring a dead time. Signals to be supplied from the AND gates 24U, 24V, and 24W to the parallel-to-serial conversion circuit 26 are signals corresponding to the control signals $S_{OUj}$, $S_{OVj}$, and $S_{OWj}$, respectively, and used as the control signals for controlling the on/off operation of the power transistors $5_{Uj}$, $5_{Vj}$, and $5_{Wj}$, respectively.

The parallel-to-serial conversion circuit 26 subjects the control signals received from the AND gates 24U, 24V, and 24W to parallel-to-serial conversion to generate a serial control signal, and transmits the serial control signal to the transmitter circuit 13 of the isolator 11. The transmitter circuit 13 transmits the control signal subjected to the parallel-to-serial conversion to the receiver circuit 15 integrated on the second semiconductor substrate 17 through AC coupling (inductor coupling) configured by the coils 14a and 14b.

An output logic circuit $21b$ is incrementally integrated on the second semiconductor substrate 17 in addition to the receiver circuit 15 and the pre-drivers 12U, 12V, and 12W. The output logic circuit $21b$ includes a serial-to-parallel conversion circuit 27, and AND gates 28U, 28V, 28W. The serial-to-parallel conversion circuit 27 subjects the serial control signal received by the receiver circuit 15 to serial-to-parallel conversion to restore the control signal for controlling the on/off operation of the power transistors $S_{Uj}$, $5_{Vj}$, and $5_{Wj}$. In this situation, the serial-to-parallel conversion circuit 27 outputs signals corresponding to the control signals $S_{OUj}$, $S_{OVj}$, and $S_{OWj}$ to the AND gates 28U, 28V, and 28W, respectively.

The AND gates 28U, 28V, and 28W configure a circuit for preventing two or more of the power transistors $t_{Uj}$, $5_{Vj}$, and $5_{Wj}$ from turning on at the same time as with the protection circuit 22 of the second embodiment. In more detail, an input of the AND gate 28U receives the control signal corresponding to the control signal $S_{OUj}$ received from the serial-to-parallel conversion circuit 27, and also receives the inversion signals of the output signals of the pre-drivers 12V and 12W. Likewise, an input of the AND gate 28V receives the control signal corresponding to the control signal $S_{OVj}$ received from the serial-to-parallel conversion circuit 27, and also receives the inversion signals of the output signals of the pre-drivers 12W and 12U. Further, an input of the AND gate 28W receives the control signal corresponding to the control signal $S_{OWj}$ received from the serial-to-parallel conversion circuit 27, and also receives the inversion signals of the output signals of the pre-drivers 12U and 12V. The output signals of the AND gates 28U, 28V, and 28W are supplied to the pre-drivers 12U, 12V, and 12W, respectively, and used as the control signals for controlling the on/off operation of the power transistors $5_{Uj}$, $5_{Vj}$, and $5_{Wj}$.

As described above, in this embodiment, the parallel-to-serial conversion circuit 26 and the serial-to-parallel conversion circuit 27 are integrated into the driver IC 3j to reduce the number of communication links (configured by the transmitter circuit 13, the coils 14a, 14b, and the receiver circuit 15). With this configuration, the area of the first semiconductor substrate 16 is effectively reduced.

Likewise, in the driver IC 4k that drives the power transistors $6_{kU}$, $6_{kV}$, and $6_{kW}$, the input logic circuit 21a and the output logic circuit 21b (including the parallel-to-serial conversion circuit 26 and the serial-to-parallel conversion circuit 27, respectively) are integrated together to realize the same function.

In this embodiment using the parallel-to-serial conversion circuit 26 and the serial-to-parallel conversion circuit 27, there arises such a problem that a delay of the control signals supplied to the pre-drivers 12U, 12V, and 12W is different from each other. For example, let us consider a case in which the control signal to be supplied to the pre-driver 12U is first transmitted from the parallel-to-serial conversion circuit 26 to the serial-to-parallel conversion circuit 27, the control signal to be supplied to the pre-driver 12V is then transmitted, and the control signal to be supplied to the pre-driver 12W is finally transmitted. In this case, the delay of the control signal to be supplied to the pre-driver 12U becomes smaller, and the delay of the control signal to be supplied to the pre-driver 12W becomes larger. This may lead to such a problem that phase differences between the respective U-phase, V-phase, and W-phase are not maintained at 120°.

Figure 7B:
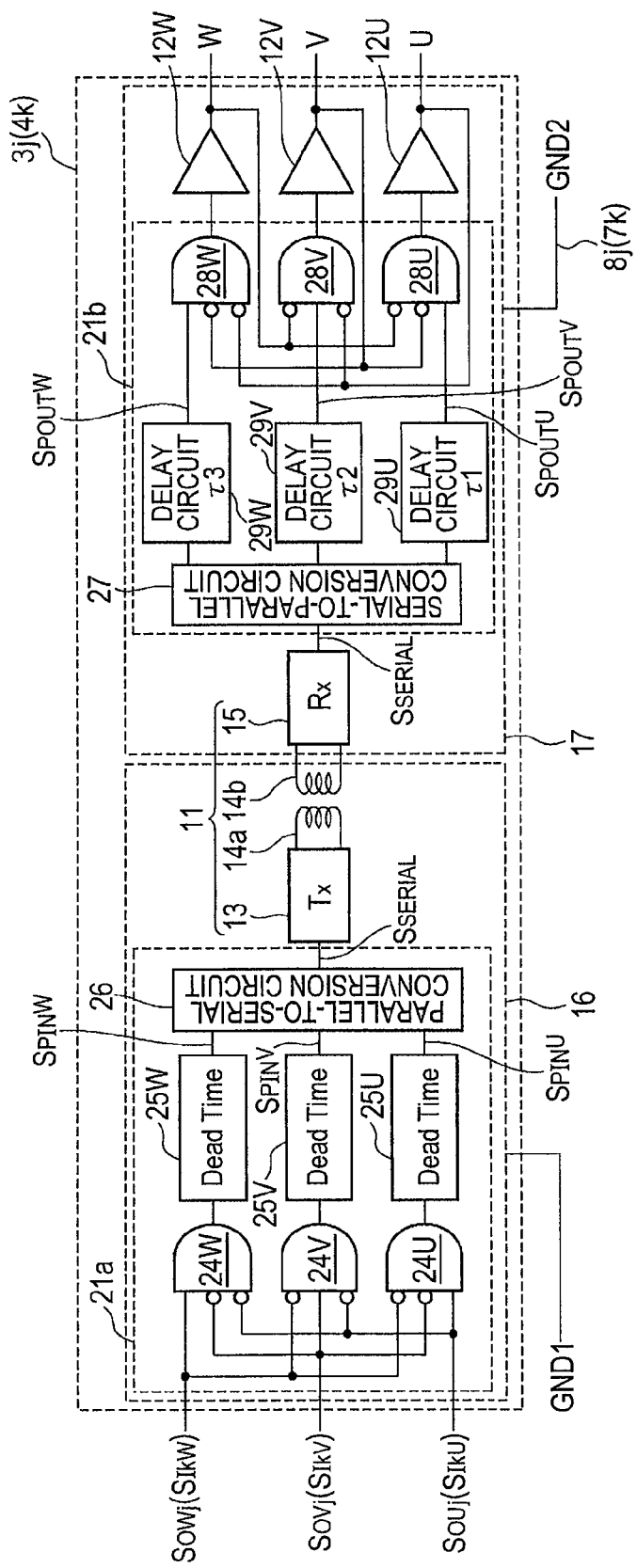
FIG. 7B is a block diagram illustrating another configuration of the driver IC in the power converter according to the third embodiment.

In order to cope with the above problem, as illustrated in FIG. 7B, delay circuits 29U, 29V, and 29W may be provided to an output of the serial-to-parallel conversion circuit 27. Delay times τ1, τ2, and τ3 of the delay circuits 29U, 29V, and 29W are determined according to a sequence of transmitting the control signal to the pre-drivers 12U, 12V, and 12W. For example, let us consider a case in which the control signal to be supplied to the pre-driver 12U is first supplied to the serial-to-parallel conversion circuit 27 from the parallel-to-serial conversion circuit 26, the control signal to be supplied to the pre-driver 12V is then transmitted, and the control signal to be supplied to the pre-driver 12W is finally transmitted. In this case, the delay times τ1, τ2, and τ3 of the delay circuit 29U are set to satisfy a relationship of τ1>τ2>τ3.

Figure 7C:
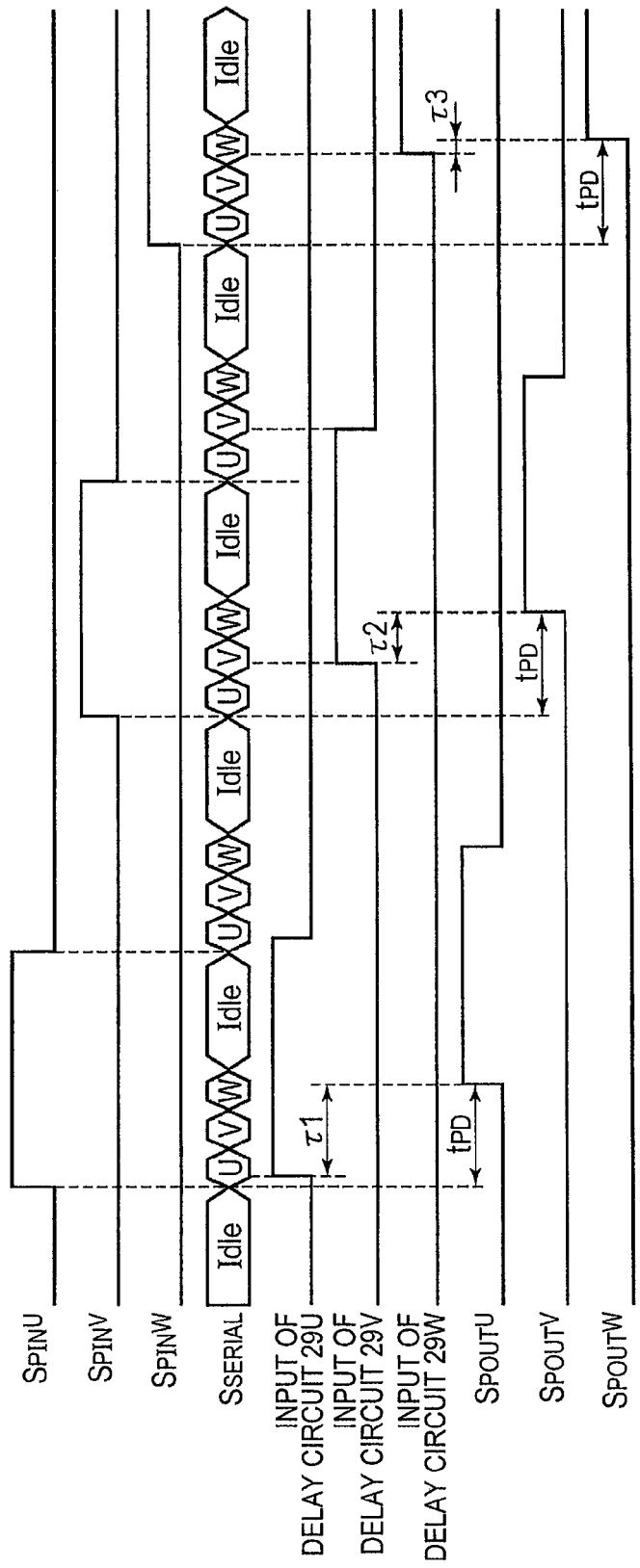
FIG. 7C is a timing chart illustrating the operation of the driver IC in FIG. 7B.

FIG. 7C is a timing chart illustrating the operation of the driver IC 3j of the configuration in FIG. 7B. FIG. 7C illustrates an example of waveforms of output signals $S_{PIN}^{U}$, $S_{PIN}^{V}$, and $S_{PIN}^{W}$ of the delay circuits 25U, 25V, and 25W, a transmission signal $S_{SERIAL}$ to be transmitted from the parallel-to-serial conversion circuit 26 to the serial-to-parallel conversion circuit 27, input signals of the delay circuits 29U, 29V, and 29W, output signals $S_{POUT}^{U}$, $S_{POUT}^{V}$, and $S_{POUT}^{W}$ of the delay circuits 29U, 29V, and 29W.

Upon detecting a rising edge or a falling edge of any one of the output signals $S_{PIN}^{U}$, $S_{PIN}^{V}$, and $S_{PIN}^{W}$ of the delay circuits 25U, 25V, and 25W, the parallel-to-serial conversion circuit 26 subjects values of the output signals $S_{PIN}^{U}$, $S_{PIN}^{V}$, and $S_{PIN}^{W}$ of the delay circuits 25U, 25V, and 25W immediately after the rising edge to parallel-to-serial conversion to generate an output signal transmission signal $S_{SERIAL}$, and transmits the transmission signal $S_{SERIAL}$ to the serial-to-parallel conversion circuit 27. In this example, in the waveform of the transmission signal $S_{SERIAL}$ illustrated in FIG. 7C, symbol "U" indicates a value of the output signal $S_{PIN}^{U}$ of the delay circuit 25U, symbol "V" indicates a value of the output signal $S_{PIN}^{V}$ of the delay circuit 25V, and symbol "W" indicates a value of the output signal $S_{PIN}^{W}$ of the delay circuit 25W. In this embodiment, the output signals $S_{PIN}^{U}$, $S_{PIN}^{V}$, PIN and $S_{PIN}^{W}$ of the delay circuits 25U, 25V, and 25W are transmitted to the serial-to-parallel conversion circuit 27 in the stated order.

The serial-to-parallel conversion circuit 27 subjects the signal received from the parallel-to-serial conversion circuit 26 to serial-to-parallel conversion. In this situation, in the output signals of the serial-to-parallel conversion circuit 27 (that is, input signals of the delay circuits 29U, 29V, and 29W), the delay is different between the respective U-phase, V-phase, and W-phase. A delay time since the output signal $S_{PIN}^{U}$ of the delay circuit 25U rises till the input signal of the delay circuit 29U rises is shortest, a delay time since the output signal $S_{PIN}^{V}$ of the delay circuit 25V rises till the input signal of the delay circuit 29V rises is second shortest, and a delay time since the output signal $S_{PIN}^{W}$ of the delay circuit 25W rises till the input signal of the delay circuit 29W rises is longest.

In the circuit configuration of FIG. 7B, the difference in the delays between the respective U-phase, V-phase, and W-phase is eliminated. In detail, the delay times τ1, τ2, and τ3 of the delay circuits 29U, 29V, and 29W are adjusted so that delay times tPD since the rising edges of the respective output signals $S_{PIN}^{U}$, $S_{PIN}^{V}$, and $S_{PIN}^{W}$ of the delay circuits 25U, 25V, and 25W till the rising edges of the respective output signals $S_{POUT}^{U}$, $S_{POUT}^{V}$, and $S_{POUT}^{W}$ of the delay circuits 29U, 29V, and 29W are identical with each other. This eliminates such a problem that the delays of the control signal to be supplied to pre-drivers 12U, 12V, and 12W are different from each other.

Figure 8:
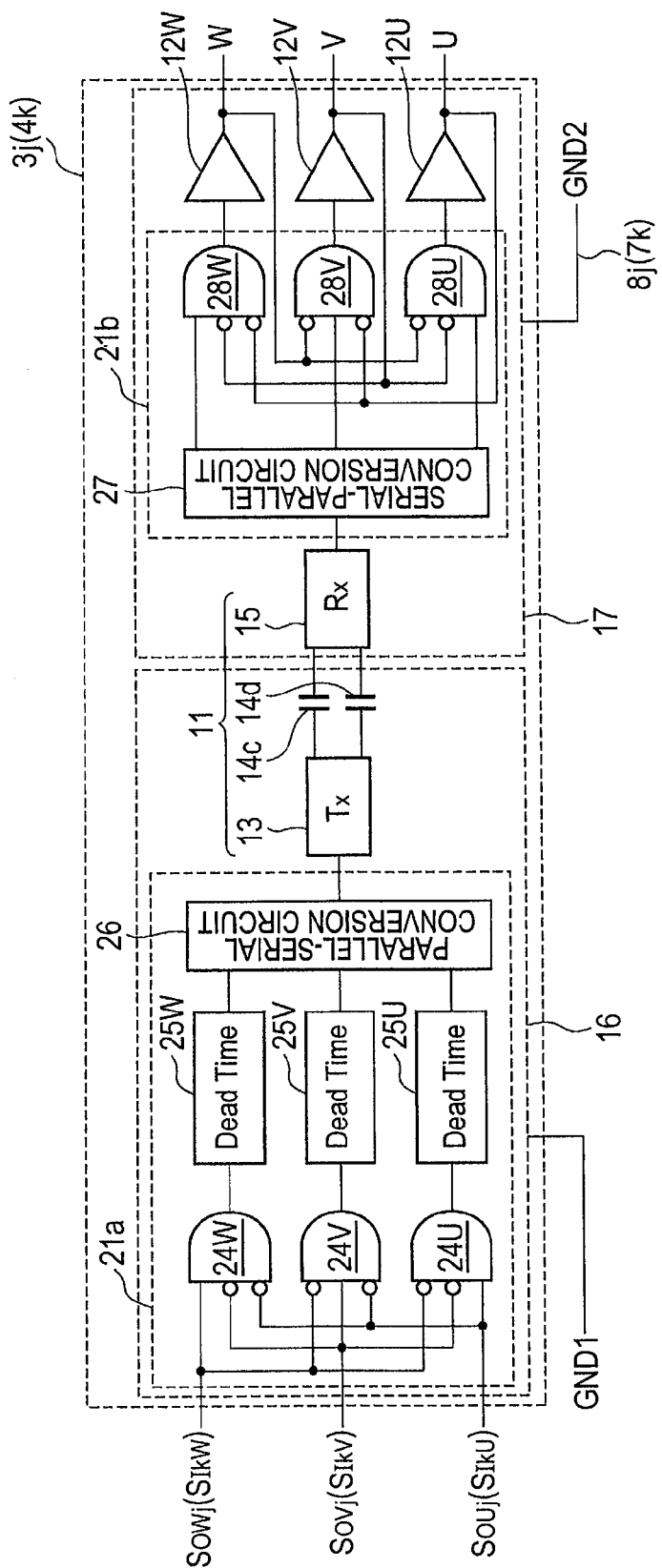
FIG. 8 is a block diagram illustrating still another configuration of the driver IC in the power converter according to the third embodiment.

Also, in this embodiment, the control signal is transferred from the transmitter circuit 13 to the receiver circuit 15 with the use of the inductor coupling configured by the coils 14a, 14b. Alternatively, the control signal may be transferred with the use of the capacitor coupling instead of the inductor coupling. In this case, as illustrated in FIG. 8, the transmitter circuit 13 and the receiver circuit 15 are connected to each other through capacitors 14c and 14d. Likewise, in the other embodiments (including the first embodiment and the second embodiment), the control signal may be transferred with the use of the capacitor coupling instead of the inductor coupling.

Fourth Embodiment

Figure 9:
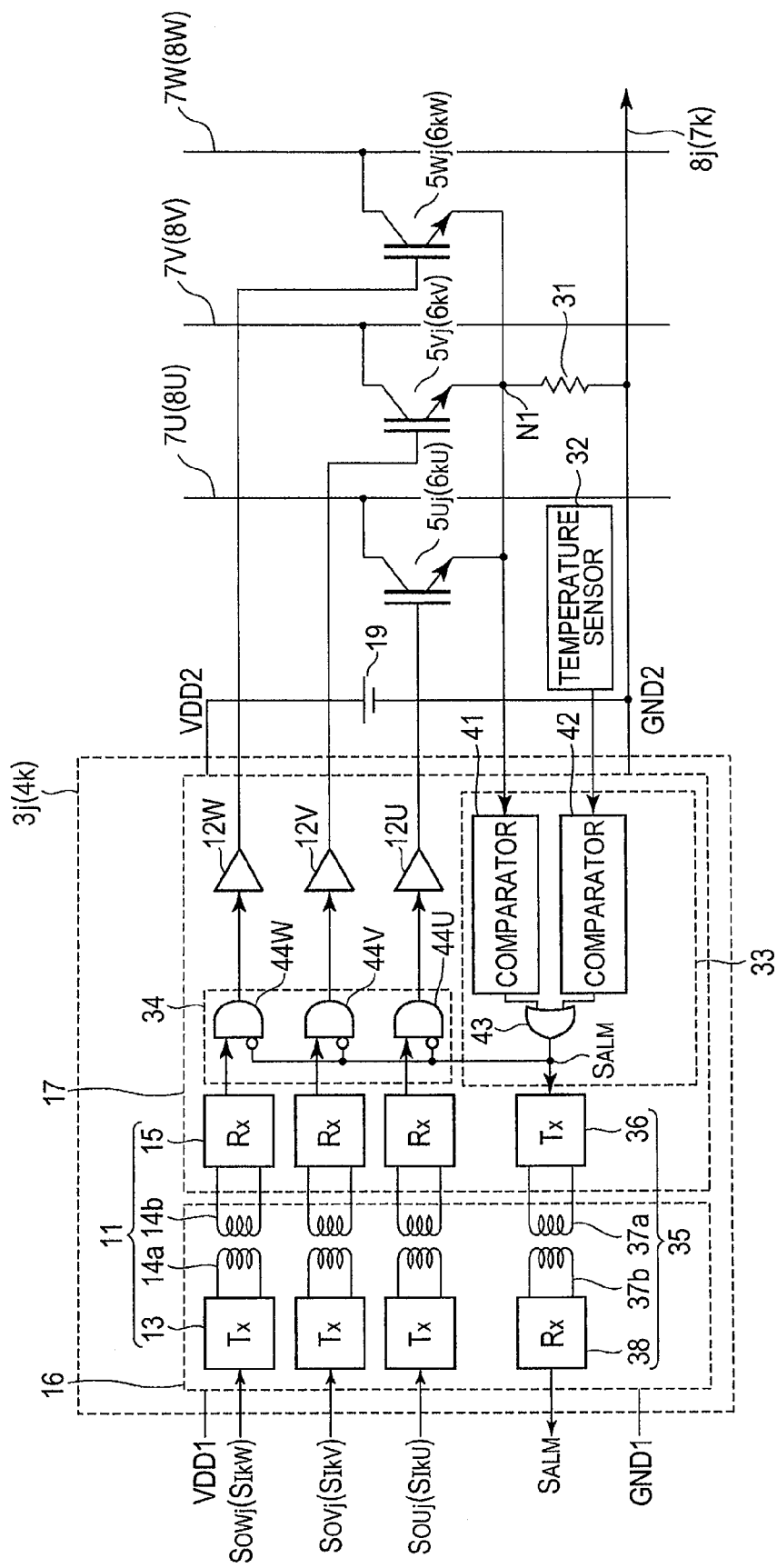
FIG. 9 is a block diagram illustrating a configuration of a driver IC in a power converter according to a fourth embodiment.

FIG. 9 is a block diagram illustrating a configuration of a portion corresponding to one driver IC 3j in a power converter according to a fourth embodiment. In the first to third embodiments, the isolator 11 is configured to transmit the signal from the first semiconductor substrate 16 to the second semiconductor substrate 17. On the other hand, in the fourth embodiment, an isolator 35 is provided to transmit the signal from the second semiconductor substrate 17 to the first semiconductor substrate 16, to thereby enable the signal to be transmitted bi-directionally between the first semiconductor substrate 16 and the second semiconductor substrate 17. In detail, the isolator 35 includes transmitter circuits 36, coils 37a, 37b, and receiver circuits 38. The transmitter circuits 36 are integrated on the second semiconductor substrate 17, and the coils 37a, 37b, and the receiver circuits 38 are integrated on the first semiconductor substrate 16. In this embodiment, the signal can be transmitted from the second semiconductor substrate 17 to the first semiconductor substrate 16. In this embodiment, the signal can be transmitted from the second semiconductor substrate 17 to the first semiconductor substrate 16. Because the isolators 11 and 35 using the AC coupling (inductor coupling or capacitor coupling) can be formed in a CMOS process, a bidirectional communication using a plurality of communication links can be realized at the low costs.

A function of transmitting the signal from the second semiconductor substrate 17 to the first semiconductor substrate 16 can be used for a variety of intended purposes. As an example, this embodiment provides a configuration in which the abnormality of the power converter is detected, and a fault signal $S_{ALM}$ indicative of the abnormality of the power converter is transferred from the second semiconductor substrate 17 to the first semiconductor substrate 16.

More specifically, the emitter terminals of the power transistors $5_{Uj}$, $5_{Vj}$, and $5_{Wj}$ are commonly connected to a node N1, and a resistive element 31 is connected between the node N1 and the output line 8j. As will be described later, the resistive element 31 is used to detect the abnormality of a current flowing in the power transistors $5_{Uj}$, $5_{Vj}$, and $5_{Wj}$. When currents flowing in the power transistors $5_{Uj}$, $5_{Vj}$, and $5_{Wj}$ excessively rise, a potential of the node N1 excessively rises due to a voltage drop across the resistive element 31. Therefore, the currents flowing in the power transistors $5_{Uj}$, $5_{Vj}$, and $5_{Wj}$ can be monitored by detecting the potential of the node N1.

In addition, a temperature sensor 32 that detects a temperature of the power converter is provided. The temperature sensor 32 is used to detect an abnormal rise in the temperature of the power converter.

Further, a fault detector circuit 33 and a protection circuit 34 are integrated on the second semiconductor substrate 17. The fault detector circuit 33 is configured to detect the abnormality of the power converter, and includes comparators 41, 42, and an OR gate 43 in this embodiment. The comparator 41 compares a potential of the node N1 with a given reference value, and sets an output thereof to "1" if the potential of the node N1 is higher than the reference value. If not, the comparator 41 sets the output to "0". The comparator 42 compares a temperature detected by the temperature sensor 32 with a given reference value, and sets an output thereof to "1" if the detected temperature is higher than the reference value. If not, the comparator 42 sets the output to "0". The OR gate 43 outputs a signal indicative of an OR of the outputs of the comparators 41 and 42. A signal output from the OR gate 43 is used as the fault signal $S_{ALM}$.

When no abnormality is detected (when the fault signal $S_{ALM}$ becomes "1" in this embodiment), the protection circuit 34 has a function of inactivating the outputs of the pre-drivers 12U, 12V, and 12W, an coercively turning off the power transistors $5_{Uj}$, $5_{Vj}$, and $5_{Wj}$. In detail, the protection circuit 34 provides AND gates 44U, 44V, and 44W. The AND gate 44U receives the inversion signal of the fault signal $S_{ALM}$, and the control signal $S_{OUj}$. Likewise, the AND gate 44V receives an inversion signal of the fault signal $S_{ALM}$, and the control signal $S_{OVj}$, and the AND gate 44W receives the inversion signal of the fault signal $S_{ALM}$, and the control signal $S_{OWj}$. When the fault signal $S_{ALM}$ is set to "1", the outputs of the AND gates 44U, 44V, and 44W become "0" regardless of the control signals $S_{OUj}$, $S_{OVj}$, and $S_{OWj}$, and all of the power transistors $5_{Uj}$, $5_{Vj}$, and $5_{Wj}$ turn on. As a result, the power converter according to this embodiment is protected.

In addition, the fault signal $S_{ALM}$ is transmitted from the second semiconductor substrate 17 to the first semiconductor substrate 16 by a communication link configured by the transmitter circuits 36, the coils 37a, 37b, and the receiver circuits 38. The fault signal $S_{ALM}$ is output from the first semiconductor substrate 16, and transferred to, for example, the control circuit 10. As a result, the control circuit 10 can recognize the abnormality of the power converter according to this embodiment.

Similarly, the driver IC 4k that drives the power transistors $6_{kU}$, $6_{kV}$, and $6_{kW}$ may be configured so that the isolator 11 can transmit the signal bi-directionally between the first semiconductor substrate 16 and the second semiconductor substrate 17. In addition, the driver IC 4k may be configured to realize the protection function with the use of the fault detector circuit 33 and the protection circuit 34, and also transmit the fault signal $S_{ALM}$ from the second semiconductor substrate 17 to the first semiconductor substrate 16 to output the fault signal $S_{ALM}$ from the first semiconductor substrate 16 to the external.

Figure 10:
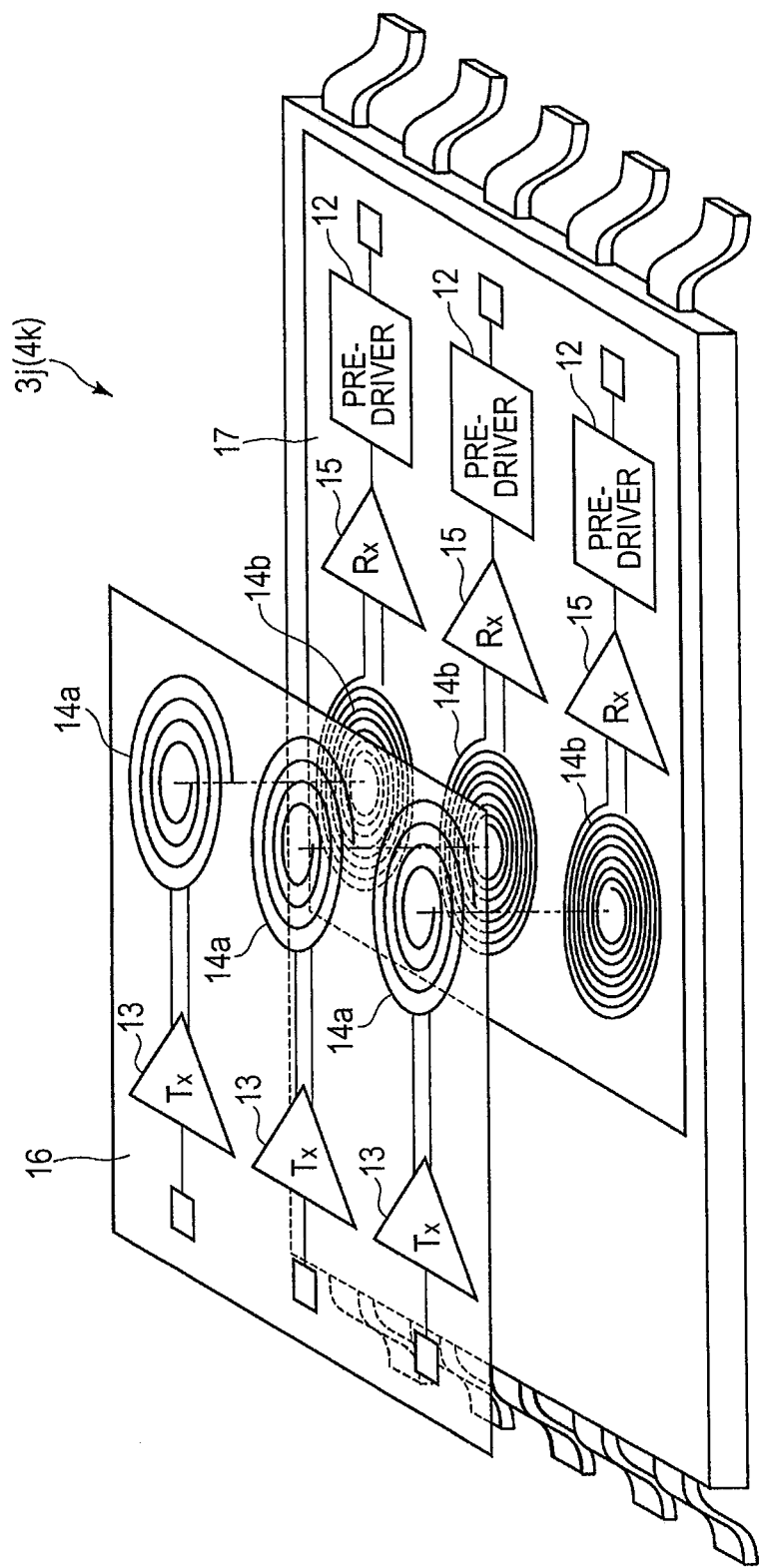
FIG. 10 is a perspective view conceptually illustrating a configuration of a driver IC in a modified example of the above-mentioned embodiment.

In the above embodiment, the coils 14a and 14b are integrated on the first semiconductor substrate 16. Alternatively, the coils 14a and 14b may be integrated on the second semiconductor substrate 17. Also, as illustrated in FIG. 10, the transmitter circuits 13 and the coils 14a may be integrated on the first semiconductor substrate 16, and the coils 14b, the receiver circuits 15, and the pre-drivers 12 may be integrated on the second semiconductor substrate 17.

Fifth Embodiment

Figure 11A:
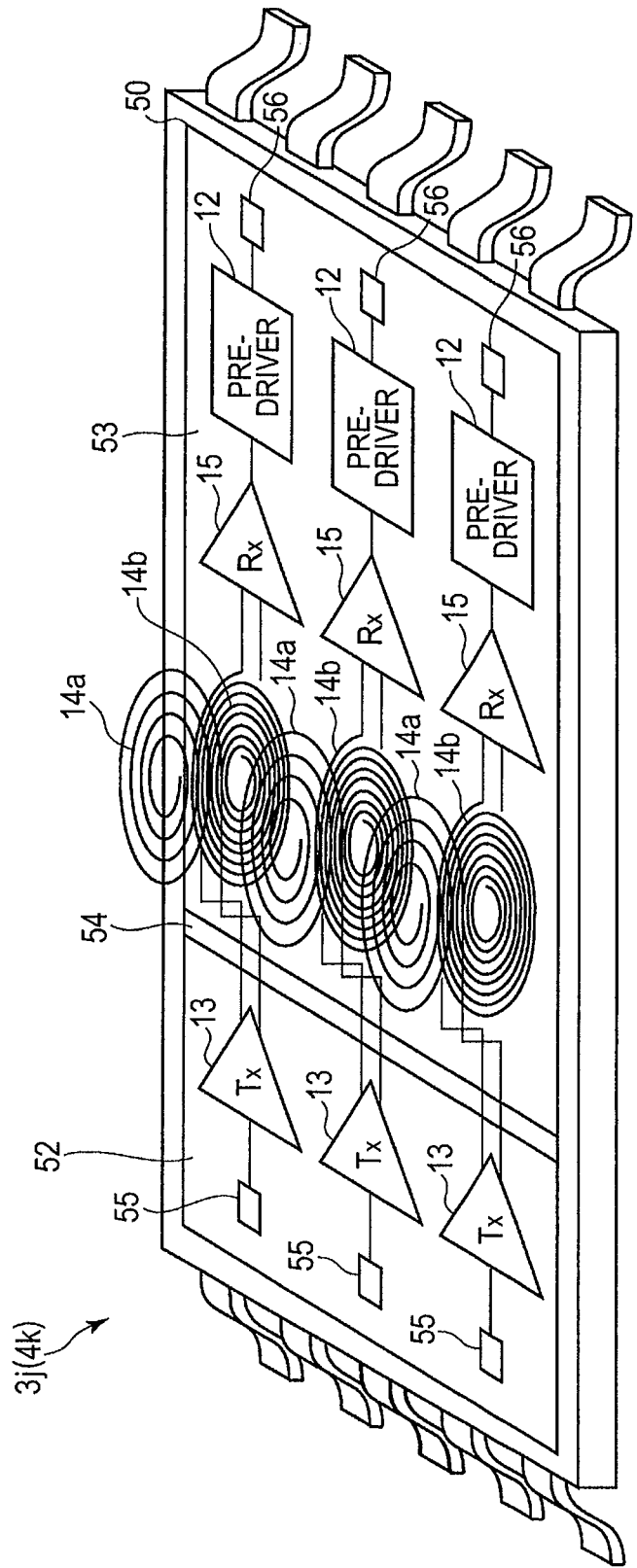
FIG. 11A is a perspective view conceptually illustrating a configuration of a driver IC in a power converter according to a fifth embodiment.
Figure 11B:
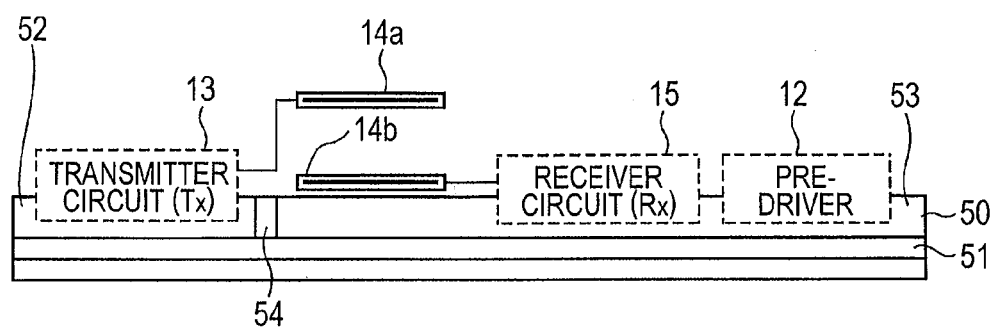
FIG. 11B is a cross-sectional view conceptually illustrating the configuration of the driver IC in the power converter according to the fifth embodiment.

FIG. 11A is a perspective view conceptually illustrating a configuration of the driver IC 3j in a power converter according to a fifth embodiment. FIG. 11B is a cross-sectional view conceptually illustrating the configuration of the driver IC 3j. In this embodiment, the transmitter circuits 13, the coils 14a, 14b, the receiver circuits 15, and the pre-drivers 12 are integrated monolithically (that is, into an identical chip). In order to realize the above configuration, in this embodiment, an SOI (semiconductor on insulator) technique is used.

In detail as illustrated in FIG. 11B, a buried insulating layer 51 is formed in the interior of an SOI substrate 50, and portions of the SOI substrate 50 closer to a surface thereof than the buried insulating layer 51 are used as a first semiconductor region 52 and a second semiconductor region 53. The first semiconductor region 52 and the second semiconductor region 53 are electrically isolated from each other by an STI (shallow trench isolation) region 54 made of an insulator (for example, silicon oxide or silicon nitride), which arrives at the buried insulating layer 51 from the surface of the SOI substrate 50.

In this embodiment, input pads 55 and the transmitter circuits 13 are integrated in the first semiconductor region 52. The input pads 55 are connected to the inputs of the transmitter circuits 13, and the control signals $S_{OUj}$, $S_{OVj}$, and $S_{OWj}$ for controlling the power transistors $5_{Uj}$, $5_{Vj}$, and $5_{Wj}$ are supplied to the transmitter circuits 13 from the input pads 55. The transmitter circuits 13 transmit the respective control signals $S_{OUj}$, $S_{OVj}$, and $S_{OWj}$ to the receiver circuits 15 through the coils 14a and 14b.

The coils 14a, 14b, the receiver circuits 15, the pre-drivers 12, and output pads 56 are integrated in the second semiconductor region 53. The receiver circuits 15 transmit the control signals and $S_{OUj}$, $S_{OVj}$, and $S_{OWj}$ received from the transmitter circuits 13 through the coils 14a and 14b to the pre-drivers 12. The pre-drivers 12 drive the gates of power transistors $5_{Uj}$, $5_{Vj}$, and $5_{Wj}$ in response to the control signals $S_{OUj}$, $S_{OVj}$, and $S_{OWj}$.

In the fifth embodiment, the receiver circuits 15 are integrated in the first semiconductor region 52, and the receiver circuits 15 and the pre-drivers 12 are integrated in the second semiconductor region 53 electrically isolated from the first semiconductor region 52. With the above configuration, the pre-drivers 12 are isolated from the input terminals (that is, the input pads 55) of the driver IC 3j. In the fifth embodiment thus configured, since only a single chip is integrated in each of the driver ICs 3j, this configuration is further advantageous in a reduction in the costs.

Figure 12:
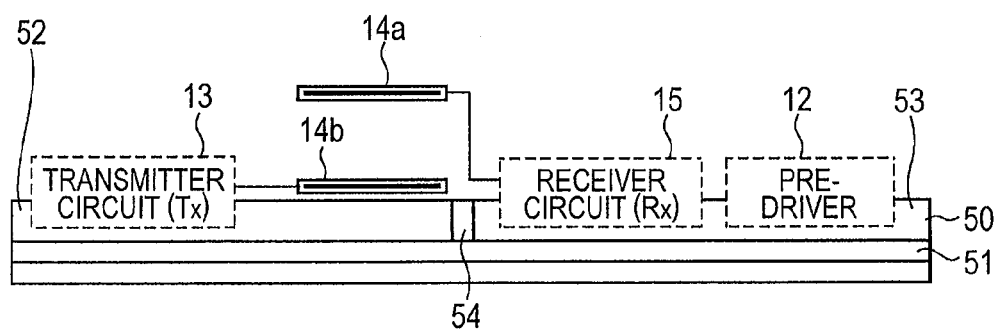
FIG. 12 is a cross-sectional view conceptually illustrating another configuration of the driver IC in the power converter according to the fifth embodiment.

FIGS. 11A and 11B illustrate a configuration in which the coils 14a and 14b are integrated in the second semiconductor region 53. Alternatively, as illustrated in FIG. 12, the coils 14a and 14b may be integrated in the first semiconductor region 52.

Similarly, in the driver IC 4k that drives the power transistors $6_{kU}$, $6_{kV}$, and $6_{kW}$, the transmitter circuits 13, the coils 14a, 14b, the receiver circuits 15, and the pre-drivers 12 may be integrated on the identical SOI substrate 50. Similarly, in this case, the transmitter circuits 13 are integrated in the first semiconductor region 52, and the receiver circuits 15 and the pre-drivers 12 are integrated in the second semiconductor region 53 electrically isolated from the first semiconductor region 52.

Sixth Embodiment

Figure 13:
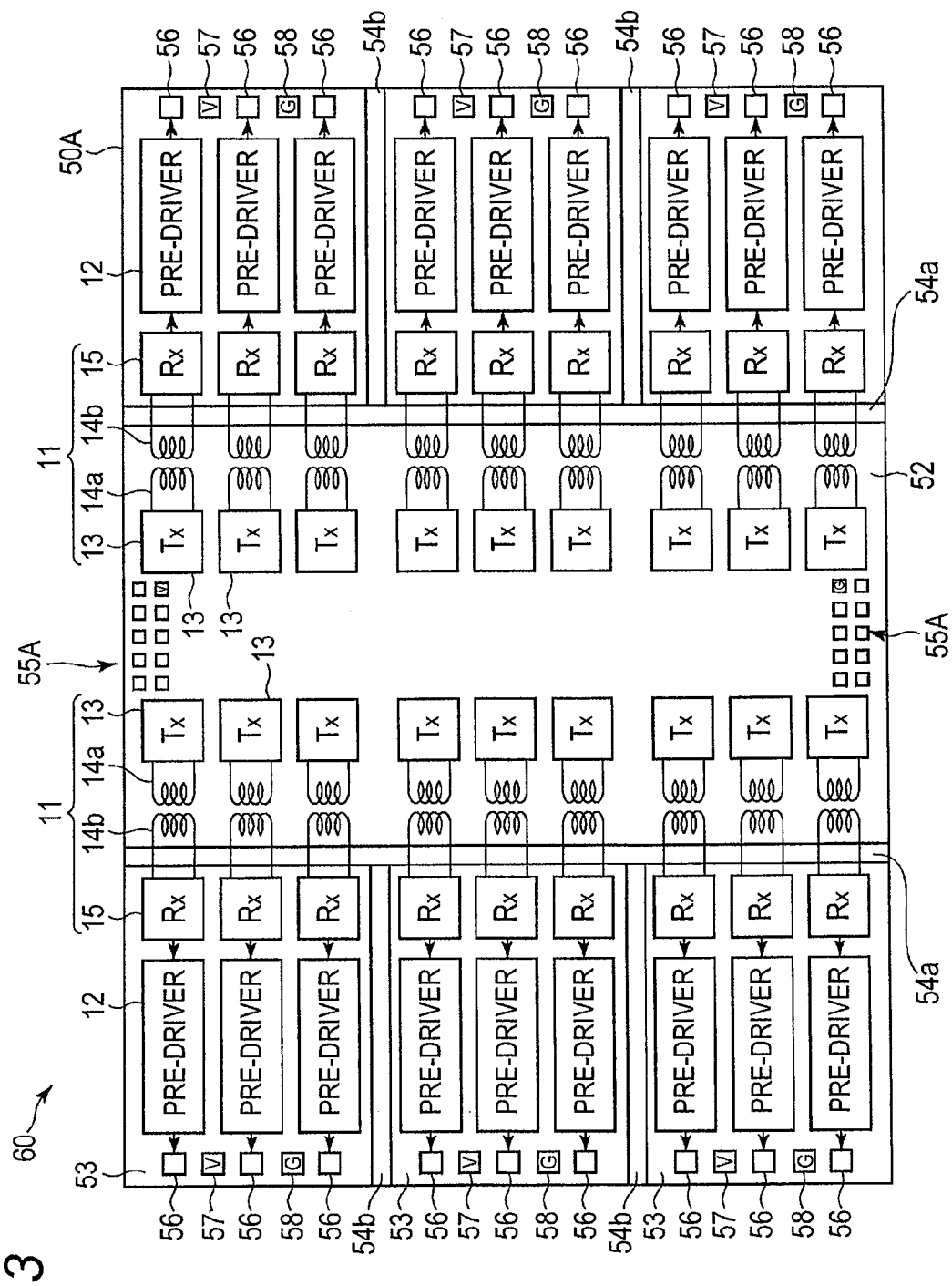
FIG. 13 is a plan view illustrating a configuration of a driver IC in a power converter according to a sixth embodiment.

FIG. 13 is a conceptual diagram illustrating a configuration of a driver IC 60 in a power converter according to a sixth embodiment of the present invention. In the driver IC 60 according to the sixth embodiment, a circuit group for realizing a function of the six driver ICs 3U, 3V, 3W, 4U, 4V, and 4W used in the three-phase matrix converter 1 of FIG. 1 is integrated monolithically on a single SOI substrate 50A.

In detail, in this embodiment, the first semiconductor region 52 and the six second semiconductor regions 53 are formed on the SOI substrate 50A. The first semiconductor region 52 and the six second semiconductor region 53 are electrically isolated from each other by STI regions 54a. In addition, the adjacent second semiconductor regions 53 are electrically isolated from each other by STI regions 54b.

A circuit group for realizing the function of the first semiconductor substrate 16 of the sixth driver ICs 3U, 3V, 3W, 4U, 4V, and 4W used in the three-phase matrix -converter 1 of FIG. 1 is integrated in the first semiconductor region 52. More specifically, the transmitter circuits 13 and the coils 14a, 14b in the isolator 11, and an input pad group 55A are isolated in the first semiconductor region 52. One pad of the input pad group 55A is a power pad for applying a supply voltage VDD1 to each circuit in the first semiconductor region 52. Another pad of the input pad group 55A is a ground pad for a circuit ground GND1 of the first semiconductor region 52. The other remaining pads of the input pad group 55A are pads for supplying the control signal for controlling the power transistors 5 and 6 to the respective transmitter circuits 13.

On the other hand, a circuit group for realizing the function of the second semiconductor substrate 17 of the driver ICs 3U, 3V, 3W, 4U, 4V, and 4W used for the three-phase matrix converter 1 of FIG. 1 is integrated in each of the second semiconductor regions 53. More specifically, the receiver circuits 15, the pre-drivers 12, the output pads 56, a power pad 57, and a ground pad 58 are integrated in each of the second semiconductor regions 53. The receiver circuits 15 receive the control signals from the respective transmitter circuits 13, and supply the control signals to the respective pre-drivers 12. The outputs of the respective pre-drivers 12 are connected with the output pads 56, and the respective pre-drivers 12 drive the gate terminals of the power transistors 5 and 6 connected to the corresponding output pads 56. A supply voltage VDD2 is applied to the power pads 57 from a power supply.

The pre-drivers 12 that drive the gate terminals of the power transistors 5 or 6 each having the emitter terminal connected to a common line (input line 7 or output line 8) are integrated in each of the second semiconductor regions 53. That is, the pre-drivers 12 that drive the gate terminals of the power transistors 5 or 6 each having the emitter terminal connected to a different line are integrated in the different STI regions 54. In addition, the ground pad 58 in each of the second semiconductor regions 53 is connected to a corresponding line of the input lines 7U, 7V, 7W, and the output lines 8U, 8V, 8W. As a result, the circuit ground GND2 of each circuit in the second semiconductor regions 53 matches any potential of the input lines 7U, 7V, 7W, and the output lines 8U, 8V, 8W.

With the above configuration, the number of chips integrated in the power supply is reduced, and the costs can be further reduced.

In this embodiment, the number of second semiconductor regions 53 integrated in the identical SOI substrate 50A is not limited to six. The plurality of second semiconductor regions 53 are integrated on the identical SOI substrate 50A to obtain the advantages caused by reducing the number of chips. For example, the functions of the three driver ICs 3U, 3V, and 3W that drive the gate terminals of the power transistors 5 may be integrated on the first SOI substrate, and the three driver ICs 4U, 4V, and 4W that drive the gate terminals of the power transistors 6 may be integrated on the second SOI substrate. In this case, one first semiconductor region 52 and three second semiconductor regions 53 are integrated on each of the first SOI substrate and the second SOI substrate.

In the above-mentioned embodiment, the matrix converter that generates the AC output from the AC input is provided. The present invention can be also applied to a power converter other than the matrix converter, for example, an inverter that generates the AC output from the DC input, or a synchronous rectifier circuit that generates the DC output from the AC input.

Figure 14:
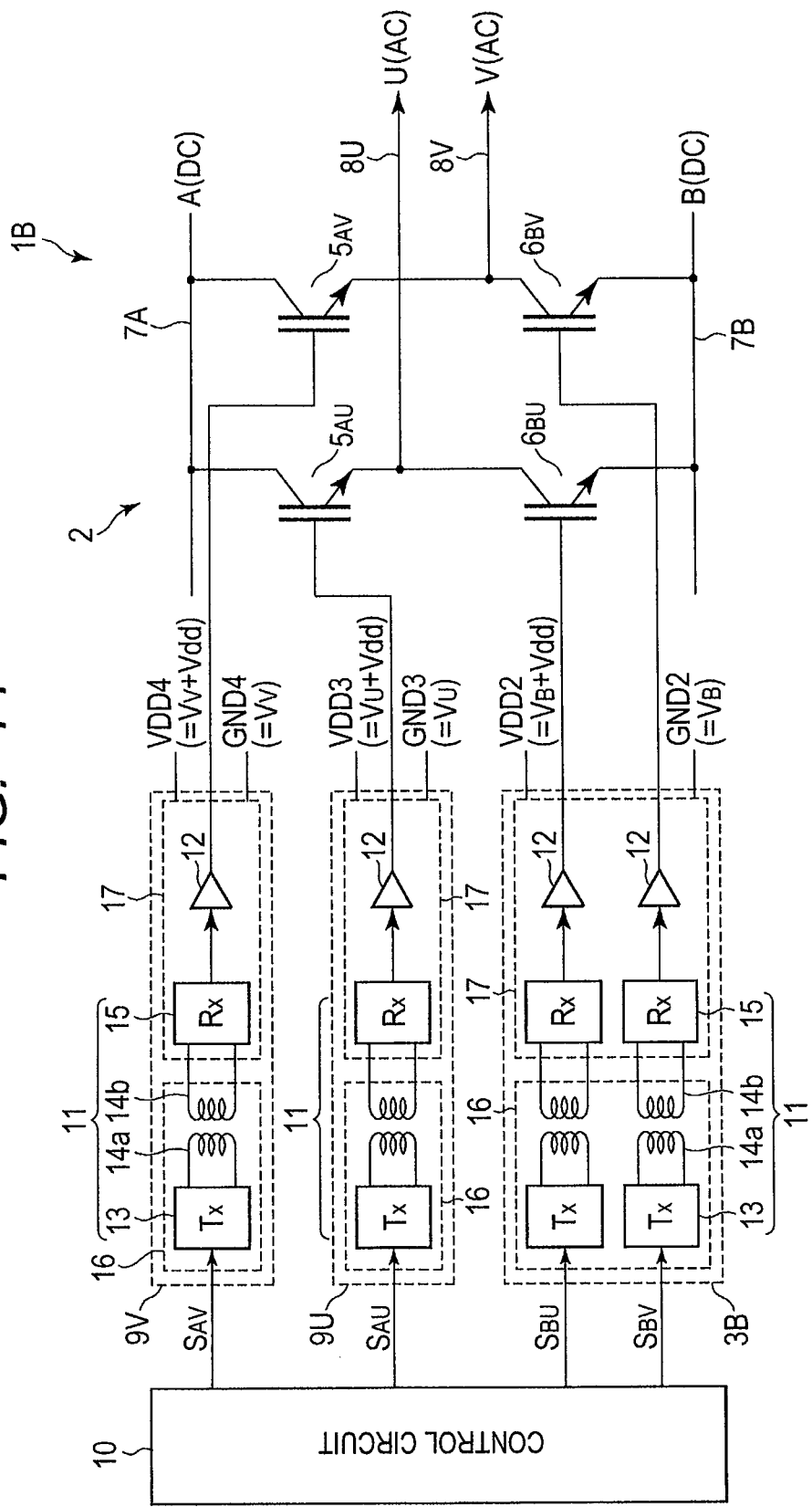
FIG. 14 is a circuit diagram illustrating a configuration of a power converter configured as an inverter in one embodiment.

For example, FIG. 14 illustrates a configuration of an inverter 1B that generates a two-phase AC output from a two-level DC input. The inverter 1B in FIG. 14 includes a transistor matrix 2B. The transistor matrix 2B includes power transistors $5_{AU}$, $5_{AV}$, $6_{BU}$, $6_{BV}$ for conducting a commutation between the input and the input, input lines 7A, 7B to which DC inputs different in voltage level are supplied, and the output lines 8U, 8V connected to the U-phase and V-phase outputs. The input lines 7A and 7B have DC potentials VA and VB, respectively. Also, the potentials of the output lines 8U and 8V are illustrated as VU and VV. The power transistors $5_{AU}$ and $5_{AV}$ conduct commutations from the input line 7A to the output lines 8U and 8V, respectively. On the other hand, the power transistors $6_{BU}$ and $6_{BV}$ conduct commutations from the output lines 8U and 8V to the input line 7B, respectively.

In the inverter 1B of FIG. 14, the number of different emitter potentials is three ($V_U$, $V_V$, $V_B$). In correspondence with those emitter potentials, three driver ICs 3U, 3V, and 4B are provided. In detail, the driver IC 3U drives the gate terminal of the power transistor $5_{AU}$, and the driver IC 3V drives the gate terminal of the power transistor $5_{AV}$. The driver IC 4B drives the gate terminals of the two power transistors $6_{BU}$ and $6_{BV}$ each having the emitter terminal commonly connected to the input line 7B.

The circuit ground GND2 of the second semiconductor substrate 17 in the driver IC 4B is connected to the input line 7B, and maintained at the potential $V_B$. On the other hand, a circuit ground GND3 of the second semiconductor substrate 17 in the driver IC 3U is connected to the output line 8U, and set to the potential $V_U$, and a circuit ground GND4 of the second semiconductor substrate 17 in the driver IC 3V is connected to the output line 8V, and set to the potential $V_V$. As the supply voltages VDD2, VDD3, and VDD4 of the driver IC 4B, the driver IC 3U, and the driver IC 3V, for example, voltages higher than the circuit grounds GND2, GND3, and GND4 by voltage Vdd are applied, respectively.

Figure 15:
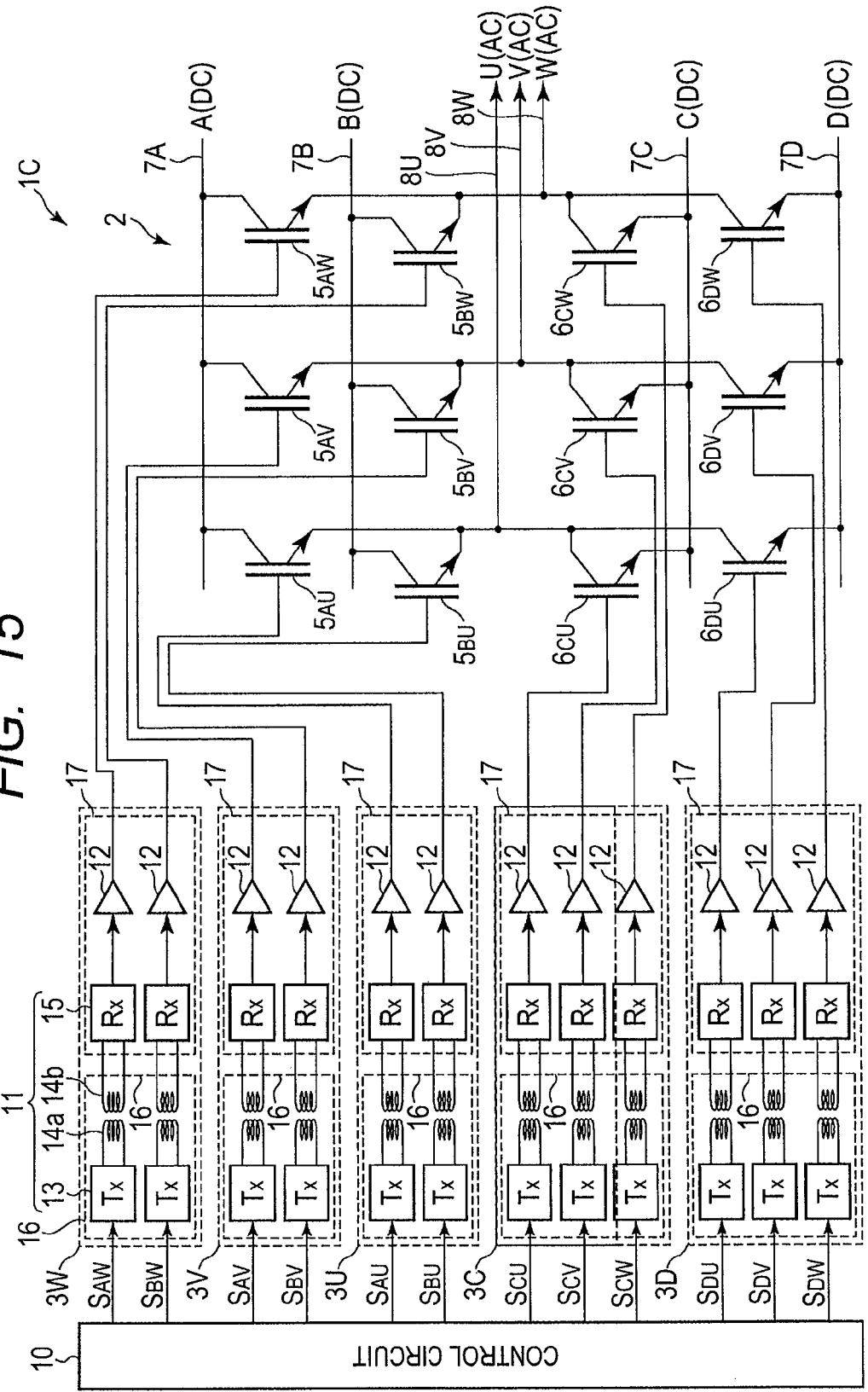
FIG. 15 is a circuit diagram illustrating a configuration of a power converter configured as a multilevel inverter in one embodiment.

FIG. 15 illustrates a configuration of an inverter 1C that generates a three phase AC output from the four level DC input. The inverter 1C in FIG. 15 includes a transistor matrix 2C. The transistor matrix 2B includes the power transistors 5, 6 for conducting a commutation between the input and the output, the input lines 7A, 7B, 7C, 7D to which DC inputs different in voltage level are supplied, and the output lines 8U, 8V, 8W connected to the U-phase, V-phase, and W-phase outputs, respectively. In FIG. 15, the power transistor that conducts the commutation from the input line 7$j$ to the output line 8$k$ is indicated by symbol $5_{jk}$, and the power transistor that conducts the commutation from the output line 8$k$ to the input line 7$j$ is indicated by symbol $6_{jk}$. In this example, j is any one of A, B, C, and D, and k is any one of U, V, and W. The input lines 7A and 7B have the DC potentials $V_A$ and $V_B$, respectively. Also, the output lines 8U, 8V, and 8W have the potentials $V_U$, $V_V$, and $V_W$ that are alternatingly changed, respectively.

In the inverter 1C of FIG. 15, the number of different emitter potentials is five ($V_U$, $V_V$, $V_W$, $V_C$, $V_D$), and in correspondence with those emitter potentials, five driver ICs 3U, 3V, 3W, 4C, 4D are provided. In detail, the driver IC 3U drives the gates of the power transistors $5_{AU}$ and $5_{BU}$ each having the emitter terminal commonly connected to the output line 8U. The circuit ground GND2 of the second semiconductor substrate 17 in the driver IC 3U is connected to the output line 8U. Also, the driver IC 3V drives the gates of the power transistors $5_{AV}$ and $5_{BV}$ each having the emitter terminal commonly connected to the output line 8V. The circuit ground GND2 of the second semiconductor substrate 17 in the driver IC 3V is connected to the output line 8V. Likewise, the driver IC 3W drives the gates of the power transistors $5_{AW}$ and $5_{BW}$ each having the emitter terminal commonly connected to the output line 8W. The circuit ground GND2 of the second semiconductor substrate 17 in the driver IC 3W is connected to the output line 8W.

On the other hand, the driver IC 4C drives the gates of the power transistors $6_{CU}$, $6_{CV}$, and $6_{CV}$ each having the emitter terminal commonly connected to the input line 7C. The circuit ground GND2 of the second semiconductor substrate 17 in the driver IC 4C is connected to the input line 7C. Further, the driver IC 4C drives the gates of the power transistors $6_{DU}$, $6_{DV}$, and $6_{DV}$ each having the emitter terminal commonly connected to the input line 7D. The circuit ground GND2 of the second semiconductor substrate 17 in the driver IC 4D is connected to the input line 7D.

Figure 16:
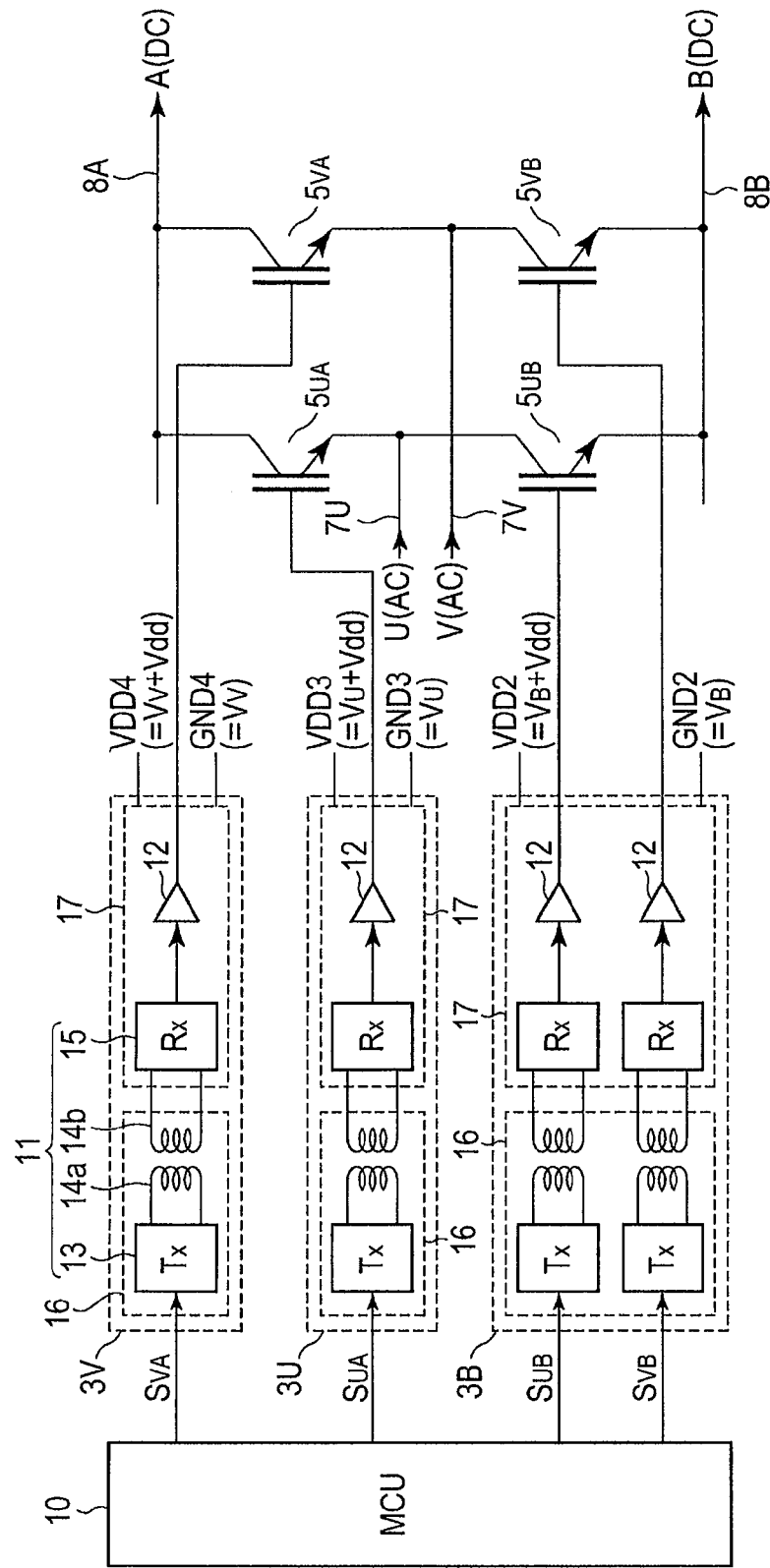
FIG. 16 is a circuit diagram illustrating a configuration of a power converter configured as a synchronous rectifier circuit in one embodiment.

FIG. 16 illustrates a configuration of a synchronous rectifier circuit 1D for generating a two-level DC output from a two-phase AC input. The synchronous rectifier circuit 1D of FIG. 16 includes a transistor matrix 2D. The transistor matrix 2D includes power transistors $6_{AU}$, $6_{AV}$, $5_{UA}$, $5_{UB}$ for conducting the commutation between the input and the output, input lines 7U, 7V connected to the U-phase and V-phase inputs, respectively, and output lines 8A, 8B connected to the DC outputs different in the voltage level. The potentials of the input lines 7U and 7V are illustrated as VU and VV, respectively. Also, the output lines 8A and 8B have DC potentials $V_A$ and $V_B$, respectively. The power transistors $6_{AU}$ and $6_{AV}$ conduct the commutations from the output line 8A to the input lines 7U and 7V, respectively. On the other hand, the power transistors $5_{UB}$ and $5_{VB}$ conduct the commutations from the input lines 7U and 7V to the output line 8B, respectively.

In the inverter 1B of FIG. 16, the number of different emitter potentials is three ($V_U$, $V_V$, $V_B$), and in correspondence with those emitter potentials, three driver ICs 4U, 4V, and 3B are provided. In detail, the driver IC 4U drives the gate terminal of the power transistor $6_{AU}$, and the driver IC 4V drives the gate terminal of the power transistor $6_{AV}$. On the other hand, the driver IC 4B drives the gate terminals of the two power transistors $5_{UB}$ and $5_{VB}$ each having an emitter terminal commonly connected to the output line 8B.

The circuit ground GND2 of the second semiconductor substrate 17 in the driver IC 3B is connected to the output line 8B, and maintained at the potential $V_B$. On the other hand, the circuit ground GND3 of the second semiconductor substrate 17 in the driver IC 4U is connected to the input line 7U, and set to the potential $V_U$. Also, the circuit ground GND4 of the second semiconductor substrate 17 in the driver IC 4V is connected to the input line 7V, and set to the potential $V_V$. As the supply voltages VDD2, VDD3, and VDD4 of the driver IC 3B, the driver IC 4U, and the driver IC 4V, for example, voltages higher than the circuit grounds GND2, GND3, and GND4 by the voltage Vdd are applied, respectively.

The invention made by the present inventors has been described above specifically with reference to the embodiments. However, the present invention is not limited to the above embodiments, but can be variously modified without departing from the spirit of the present invention. In particular, the embodiments described above can be implemented in combination without technical inconsistency.

What is claimed is:

1. A power converter comprising:
   n power transistors each having an emitter terminal or a source terminal connected to a common line; and
   a driver connected to the n power transistors,
   wherein the driver includes:
   n pre-drivers that drive gate terminals of the respective n power transistors;
   a receiver integrated monolithically with the n pre-drivers; and
   a transmitter coupled to the receiver by AC coupling,
   wherein the transmitter subjects a plurality of control signals which are input in parallel to parallel-to-serial conversion to generate a serial control signal, and
   wherein the receiver receives the serial control signal through the AC coupling, subjects the serial control signal to serial-to-parallel conversion, and outputs a plurality of corresponding control signals that control the n pre-drivers.

2. The power converter according to claim 1,
   wherein circuit grounds of the n pre-drivers and the receiver are connected to the common line.

3. The power converter according to claim 2,
wherein a circuit ground of the transmitter is isolated from the circuit grounds of the n pre-drivers and the receiver.

4. The power converter according to claim 1,
wherein the receiver includes a protection circuit that generates the plurality of corresponding control signals so that two or more of the n power transistors do not turn on at the same time.

5. The power converter according to claim 1,
wherein the driver further includes a fault detection circuit that detects an abnormality and generates a fault signal, and
wherein the receiver includes a protection circuit that inactivates outputs of the n pre-drivers in response to the fault signal.

6. The power converter according to claim 5,
wherein the driver further includes:
a second transmitter integrated monolithically with the n pre-drivers and the receiver, and
a second receiver integrated monolithically with the transmitter, which is coupled with the second transmitter by AC coupling,
wherein the second transmitter transmits the fault signal to the second receiver through the AC coupling, and
wherein the second receiver externally outputs the fault signal.

7. A power converter comprising:
n power transistors each having an emitter terminal or a source terminal connected to a common line; and
a driver connected to the n power transistors,
wherein the driver includes:
n pre-drivers that drive gate terminals of the respective n power transistors; and
a receiver integrated monolithically with the n pre-drivers; and
a transmitter coupled to the receiver by AC coupling,
wherein the receiver outputs a plurality of control signals that control the n pre-drivers in response to a plurality of signals received from the transmitter,
wherein the transmitter is integrated with a first semiconductor substrate,
wherein the n pre-drivers and the receiver are integrated with a second semiconductor substrate which is different from the first semiconductor substrate, and
wherein the first semiconductor substrate and the second semiconductor substrate are integrated in a same package.

8. The power converter according to claim 1,
wherein the n pre-drivers, the receiver, and the transmitter are integrated monolithically with a same semiconductor substrate,
wherein the transmitter is integrated with a first semiconductor area of the semiconductor substrate,
wherein the n pre-drivers and the receiver are integrated with a second semiconductor area of the semiconductor substrate, and
wherein the first semiconductor area and the second semiconductor area are isolated from each other by an insulator.

9. The power converter according to claim 8, further comprising:
m second power transistors each having an emitter terminal or a source terminal connected to a common line;
m second pre-drivers that drive respective gate terminals of the respective m second power transistors;
a second transmitter integrated in the first semiconductor area of the semiconductor substrate; and
a second receiver coupled to the second transmitter by AC coupling and that outputs a plurality of second control signals for controlling the m second pre-drivers in response to a plurality of signals received from the second transmitter,
wherein the m pre-drivers and the second receiver are integrated in a third semiconductor area of the semiconductor substrate, and
wherein the third semiconductor area is isolated from the first semiconductor area and the second semiconductor area by an insulator.

10. A matrix converter, comprising:
first to N-th input lines connected to an AC input;
first to M-th output lines connected to an AC output;
N×M first power transistors;
N×M second power transistors;
M first driver ICs; and
N second driver ICs,
wherein the respective first to M-th output lines are commonly connected with emitter terminals or source terminals of the N first power transistors that conduct commutation from the first to N-th input lines,
wherein the respective first to N-th input lines are commonly connected with emitter terminals or source terminals of the M second power transistors that conduct commutation from the first to M-th output lines,
wherein each of the M first driver ICs includes:
N first pre-drivers that drive the respective gate terminals of the N first power transistors having the emitter terminals or the source terminals commonly connected to corresponding lines of the first to M-th output lines, and
a first receiver integrated monolithically with the N first pre-drivers,
wherein each of the N second driver ICs includes:
M second pre-drivers that drive the respective gate terminals of the M second power transistors having the emitter terminals or the source terminals commonly connected to corresponding lines of the first to N-th input lines, and
a second receiver integrated monolithically with the M second pre-drivers,
wherein the first receiver is coupled with the first transmitter by AC coupling, and outputs a plurality of first control signals for control the N first pre-drivers in response to a plurality of signals received from the first transmitter, and
wherein the second receiver is coupled with the second transmitter by AC coupling, and outputs a plurality of second control signals for control the M second pre-drivers in response to a plurality of signals received from the second transmitter.

11. The matrix converter according to claim 10,
wherein respective circuit grounds of the N first pre-drivers and the first receiver in each of the M first driver ICs are connected to the first to M-th output lines, and
wherein respective circuit grounds of the M second pre-drivers and the second receiver in each of the N second driver ICs are connected the first to N-th input lines.

* * * * *